United States Patent
Andrews

(10) Patent No.: US 9,214,607 B1
(45) Date of Patent: Dec. 15, 2015

(54) WIRE BONDED LIGHT EMITTING DIODE (LED) COMPONENTS INCLUDING REFLECTIVE LAYER

(71) Applicant: Cree, Inc., Durham, NC (US)

(72) Inventor: Peter S. Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/478,147

(22) Filed: Sep. 5, 2014

(51) Int. Cl.
- *H01L 33/48* (2010.01)
- *H01L 33/50* (2010.01)
- *H01L 33/60* (2010.01)
- *H01L 33/62* (2010.01)

(52) U.S. Cl.
CPC ............ *H01L 33/486* (2013.01); *H01L 33/505* (2013.01); *H01L 33/60* (2013.01); *H01L 33/62* (2013.01); *H01L 2933/0033* (2013.01); *H01L 2933/0058* (2013.01); *H01L 2933/0066* (2013.01)

(58) Field of Classification Search
CPC ....... H01L 33/06; H01L 33/10; H01L 33/405; H01L 33/46; H01L 33/52; H01L 33/60; H01L 33/62; H01L 33/486; H01L 33/505; H01L 33/44; H01L 51/5271
See application file for complete search history.

(56) References Cited

U.S. PATENT DOCUMENTS

| | | | |
|---|---|---|---|
| 7,009,199 | B2 | 3/2006 | Hall |
| 2008/0179611 | A1 | 7/2008 | Chitnis et al. |
| 2009/0283787 | A1 | 11/2009 | Donofrio et al. |
| 2011/0031502 | A1 | 2/2011 | Bergmann et al. |
| 2012/0138982 | A1* | 6/2012 | Chen et al. ......................... 257/98 |
| 2012/0193660 | A1 | 8/2012 | Donofrio et al. |
| 2012/0193662 | A1 | 8/2012 | Donofrio et al. |
| 2012/0267661 | A1* | 10/2012 | Kim ....................... H01L 33/486 257/98 |
| 2013/0264589 | A1 | 10/2013 | Bergmann et al. |
| 2013/0264592 | A1 | 10/2013 | Bergmann et al. |
| 2014/0346547 | A1* | 11/2014 | Park ................................. 257/98 |
| 2015/0028361 | A1* | 1/2015 | Schlereth et al. ............... 257/82 |

OTHER PUBLICATIONS

Andrews entitled "*Light Emitting Diode (LED) Components Including Contact Expansion Frame and Methods of Fabricating Same*", U.S. Appl. No. 14/325,047, filed Jul. 7, 2014.
Andrews et al. entitled "*Multiple Die Light Emitting Diode (LED) Components and Methods of Fabricating Same*", U.S. Appl. No. 14/289,305, filed May 28, 2014.
Bhat et al. entitled "*Wafer Level Contact Pad Solder Bumping for Surface Mount Devices with Non-Planar Recessed Contacting Surfaces*", U.S. Appl. No. 14/152,829, filed Jan. 10, 2014.
Bhat et al. entitled "*Wafer Level Contact Pad Standoffs With Integrated Reflector*", U.S. Appl. No. 61/941,369, filed Feb. 14, 2014.

(Continued)

*Primary Examiner* — Armando Rodriguez
(74) *Attorney, Agent, or Firm* — Myers Bigel Sibley & Sajovec, P.A.

(57) ABSTRACT

A Light Emitting Diode (LED) component includes an LED die having first and second opposing faces and a sidewall. A contact is provided that is spaced apart from the LED die. The contact includes an inner face adjacent the first face and an outer face adjacent the second face. The contact may be a portion of a lead frame or a discrete contact slug. A wire bond extends between the first face and the inner face. A reflective layer is provided on the inner face that extends to the sidewall and also extends along the sidewall. The reflective layer may include white paint. Related fabrication methods are also described.

27 Claims, 31 Drawing Sheets

(56) References Cited

OTHER PUBLICATIONS

Bhat et al. entitled "*Wafer Level Contact Pad Standoffs with Integrated Reflector*", U.S. Appl. No. 14/201,490, filed Mar. 7, 2014.
Cree, Inc., "Direct Attach DA2432™ LEDs" (Data Sheet: CPR3FM Rev.—, 2011), 5 pp.
Cree, Inc., "Direct Attach DA1000™ LEDs" (Data Sheet: CPR3ES Rev. A, 2010), 5 pp.
Cree, Inc., "Direct Attach DA3547™ LEDs" (Data Sheet: CPR3EL Rev. D, 2010-2012), 5 pp.
Cree, Inc., "Cree® EZ290™ Gen II LEDs Data Sheet: CxxxEZ290-Sxx00-2" (Data Sheet: CPR3EJ, Rev—, 2010), 5 pp.
Cree, Inc., "Cree® EZ1000™ Gen II LEDs Data Sheet: CxxxEZ1000-Sxx000-2" (Data Sheet: CPR3EC, Rev A, 2009), 5 pp.
Cree, Inc., "Cree® EZ950™ Gen 3 LEDs Data Sheet: CxxxEZ950-Sxx000-3-x" (Data Sheet: CPR3FW, Rev—, 2014), 6 pp.
Donofrio et al. entitled "*Conformally Coated Light Emitting Devices and Methods for Providing the Same*", U.S. Appl. No. 13/017,845, filed Jan. 31, 2011.
Schott, Product Information Datasheet—"D 263 Thin Borosilicate Glass", Date Unknown, 2 pp., May 2013.
Cree, Inc., "Cree® TR2227™ LEDs Data Sheet Cxxx,TR2227-Sxx00" (Data Sheet: CPR3EF Rev A, 2010), 5 pp.
Cree, Inc., "TR3547™ LEDs CxxxTR3547-Sxx00 Data Sheet" (Data Sheet: CPR3FJ Rev.—, 2011), 5 pp.
Cree, Inc., "Cree ® EZ400™ Gen II LED Data Sheet: CxxxEZ400-Sxxx000-2" (Data Sheet: CPR3ED, Rev—, 2009), 5 pp.
Cree Inc., "XThin® LEDs: CxxxXT290-Sxx00-A" (Data Sheet: CPR3BV, Rev H, 2003-2006), 6 pp.
Cree, Inc., "RazerThin® Gen III LEDs: CxxxRT200-Sxxxx" (Data Sheet: CPR3DS, Rev—, 2008), 6 pp.
Cree, Inc., "RazerThin® LEDs: CxxxRT230-S0200" (Data Sheet: CPR3CO, Rev A, 2005-2006), 4 pp.
Cree, Inc., "RazerThin® Gen III LEDs: CxxxRT260-Sxxxx" (Data Sheet: CPR3DT, Rev—, 2008), 6 pp.
Cree Inc., "Cree® UltraThin™ Gen III LEDs Data Sheet: CxxxUT190-Sxxxx-31" (Data Sheet: CPR3EP, Rev A, 2010), 6 pp.
Cree, Inc., "MegaBright® Generation II LEDs: CxxxMB290-Sxx00" (Data Sheet: CPR3CK, Rev C, 2005-2006), 7 pp.
Cree, Inc., "SuperBlue™ Generation II LEDs Preliminary Data Sheet: C430CB230-S2100" (Data Sheet: CPR3DM, Rev—, 2008), 4 pp.

\* cited by examiner

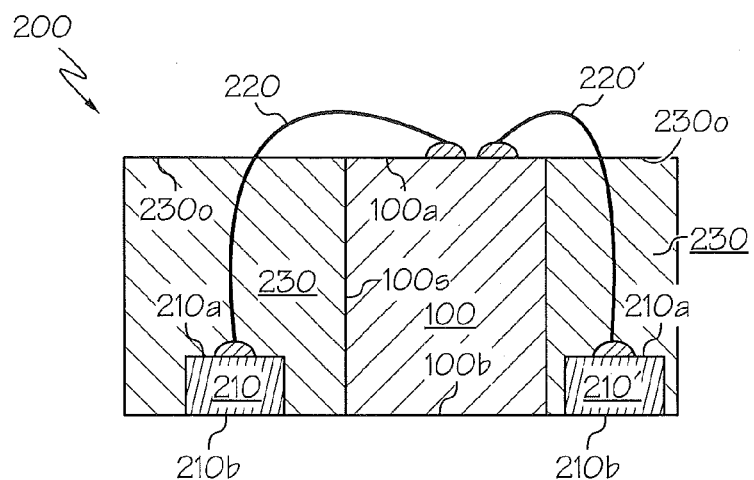
FIG. 8
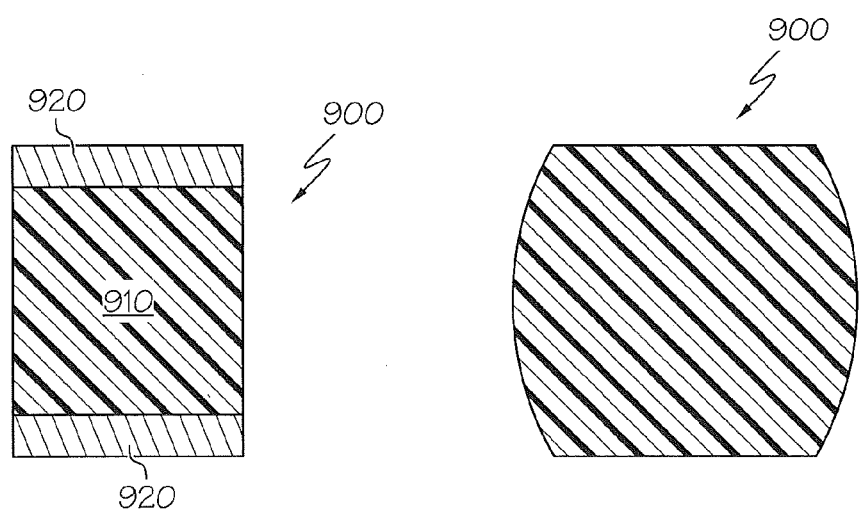
FIG. 9A
FIG. 9B

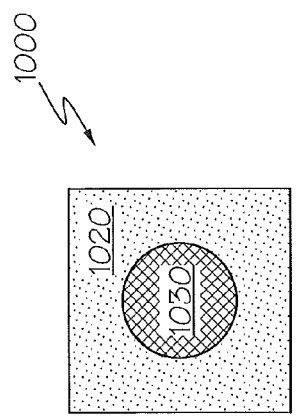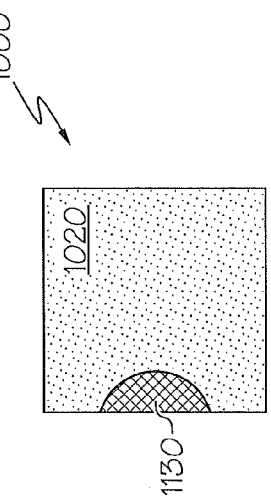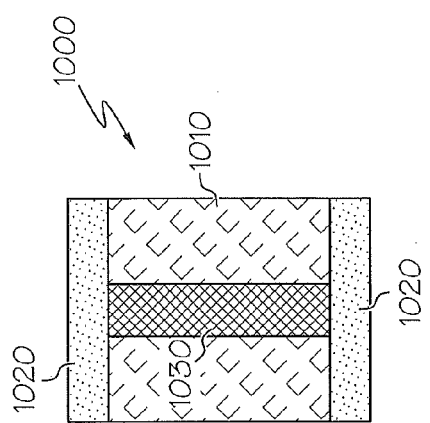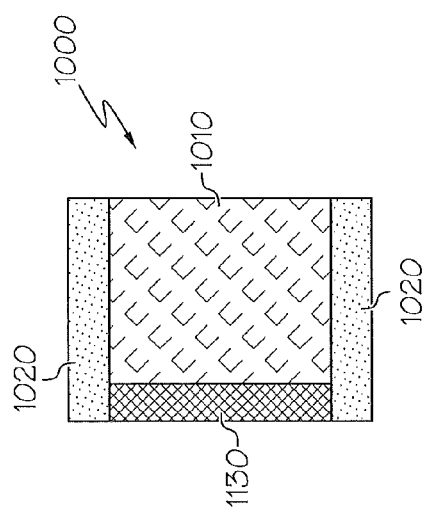
FIG. 10B
FIG. 11B
FIG. 10A
FIG. 11A

WIRE BONDED LIGHT EMITTING DIODE (LED) COMPONENTS INCLUDING REFLECTIVE LAYER

BACKGROUND

Various embodiments described herein relate to light emitting devices and assemblies and methods of manufacturing the same, and more particularly, to Light Emitting Diodes (LEDs), assemblies thereof and fabrication methods therefor.

LEDs are widely known solid-state lighting elements that are capable of generating light upon application of voltage thereto. LEDs generally include a diode region having first and second opposing faces, and include therein an n-type layer, a p-type layer and a p-n junction. An anode contact ohmically contacts the p-type layer and a cathode contact ohmically contacts the n-type layer. The diode region may be epitaxially formed on a substrate, such as a sapphire, silicon, silicon carbide, gallium arsenide, gallium nitride, etc., growth substrate, but the completed device may not include a substrate. The diode region may be fabricated, for example, from silicon carbide, gallium nitride, gallium phosphide, aluminum nitride and/or gallium arsenide-based materials and/or from organic semiconductor-based materials. Finally, the light radiated by the LED may be in the visible or ultraviolet (UV) regions, and the LED may incorporate wavelength conversion material such as phosphor.

An LED component provides a packaged LED die for mounting on a board, such as a Metal Core Printed Circuit Board (MCPCB), flexible circuit board and/or other printed circuit board, along with other electronic components, for example using surface mount technology. An LED component generally includes an LED die, a submount and other packaging elements.

Submounts are generally used in LED components to interpose an LED die and a printed circuit board. The submount may change the contact configuration of the LED die to be compatible with the pads of the printed circuit board. The submount may also be used to support a phosphor layer and/or an encapsulating dome that surrounds the LED die. The submount may also provide other functionality. Thus, a submount may include a receiving element onto which an LED die is mounted using conventional die-attach techniques, to interface the LED die and a printed circuit board. A submount generally has a thickness of at least 100 µm, and in some embodiments at least 150 µm, and in other embodiments at least 200 µm, and generally includes traces (such as on ceramic panels) and/or leads (such as in Plastic Leaded Chip Carrier (PLCC) package).

Wire bonding is often used to connect the anode contact and/or the cathode contact of an LED die to a submount. Wire bonding is widely used in the microelectronic fabrication industry, and provides a cost effective and flexible interconnect technology. Bond wires may comprise aluminum, copper, silver and/or gold. Wire bond attachment techniques may include ball bonding, wedge bonding and/or compliant bonding. In ball bonding and wedge bonding, the wire is attached at both ends using some combination of heat, pressure and ultrasonic energy to make a weld. In compliant bonding, heat and pressure is transmitted through a compliant or indentable aluminum tape.

LEDs are increasingly being used in lighting/illumination applications, with a goal being to provide a replacement for the ubiquitous incandescent light bulb.

SUMMARY

A Light Emitting Diode (LED) component according to various embodiments described herein includes an LED die that comprises first and second opposing faces and a die sidewall that extends therebetween. A contact is provided that is spaced apart from the LED die. The contact comprises an inner face adjacent the first face and an outer face adjacent the second face. A wire bond extends between the first face and the inner face. A reflective layer is provided on the inner face that extends to the die sidewall and also extends along the die sidewall. In some embodiments, the reflective layer comprises white paint.

In some embodiments, a solder layer is provided on the second face and, in some embodiments, on the outer face. In some embodiments, a layer comprising luminophoric material, such as phosphor, is provided on the first face, and the reflective layer does not extend onto the first face. In some embodiments, the reflective layer includes an outer surface that is coplanar with the first face. These embodiments may also comprise a layer comprising luminophoric material on the first face and extending onto the outer surface of the reflective layer.

In some embodiments, the contact comprises a portion of a lead frame. In some of these lead frame embodiments, the contact may include a tab that extends therefrom.

In other embodiments, the contact comprises a slug. In some embodiments, the slug comprises an insulating body, a conductive layer on opposing faces thereof, and a conductive via that extends in and/or on the insulating body to electrically connect the conductive layers on the opposing faces of the slug. The insulating body may comprise a printed circuit board or a ceramic slug. In other embodiments, the slug comprises a copper slug having a reflective metal layer on opposing faces thereof.

In any of the above embodiments, an optically transparent structure may also be provided on the reflective layer and on the first face. In some embodiments, the optically transparent structure comprises an encapsulation layer on the reflective layer and on the first face and a glass layer on the encapsulation layer, remote from the reflective layer and the first face.

In any of the above embodiments, the LED component may be provided on a board along with other electronic components. The LED component is free of a submount between the LED die and the board.

Various embodiments have been described above in connection with a single wire bond contact for the LED component. However, in other embodiments, the contact is a first contact and the wire bond is a first wire bond. The LED component may further comprise a second contact that is spaced apart from the LED die and the first contact. The second contact also comprises an inner face adjacent the first face and an outer face adjacent the second face. A second wire bond extends between the first face and the inner face of the second contact. The reflective layer also extends on the inner face of the second contact.

LED components according to various other embodiments described herein may comprise an LED die that comprises first and second opposing faces and a die sidewall extending therebetween. A slug is provided that is spaced apart from the LED. The slug comprises an inner face adjacent the first face and an outer face adjacent the second face. A wire bond extends between the first face and the inner face. A first solder structure is provided on the second face, including a first solder sidewall. A second solder structure is provided on the outer face, including a second solder sidewall that faces the first solder structure sidewall. A reflective layer extends between the first solder structure sidewall and the second solder structure sidewall. The reflective layer may comprise white paint.

In some of these embodiments, a layer comprising luminophoric material may be provided on the first face, on the die sidewall and on the reflective layer. The slug may comprise any of the embodiments that were described above. An optically transparent structure may also be provided according to any of the embodiments described above. The LED component may be mounted on a board according to any of the embodiments described above.

Moreover, in any of the above described embodiments, a second slug may also be provided. Thus, in some embodiments, the slug is a first slug, and the wire bond is a first wire bond, and the LED component may further comprise a second slug that is spaced apart from the LED die and the first slug. The second slug also comprises an inner face adjacent the first face and an outer face adjacent the second face. A second wire bond extends between the first face and the inner face of the second slug. A third solder structure is provided on the outer face of the second slug and including a third solder structure sidewall that faces the first and/or second solder structure sidewall. The reflective layer also extends between the third solder structure sidewall and the first and/or second solder structure sidewalls.

Methods of fabricating a plurality of LED components may also be provided according to various embodiments described herein. In some embodiments, a plurality of LED dies and a plurality of contacts are placed on a carrier, such that a respective one of the contacts is adjacent but spaced apart from a respective one of the LED dies. A respective LED die is wire bonded to a respective contact. A reflective layer is coated on the plurality of LED dies and on the plurality of contacts that are wire bonded. The respective LED die and the respective contact is singulated to provide the plurality of LED components.

In some embodiments, the plurality of contacts comprise portions of a lead frame, and the singulating also includes singulating the lead frame.

Some embodiments also comprise coating a layer comprising luminophoric material on the reflective layer. Moreover, in some embodiments, the coating of a reflective layer is preceded by providing a layer comprising luminophoric material on exposed faces of the LED dies but not on sidewalls thereof. In these embodiments, the coating comprises coating a reflective layer on the sidewalls of the plurality of LED dies and on the plurality of contacts that are wire bonded but not on the layer comprising luminophoric material.

In some embodiments, the carrier is removed prior to or after the singulating. In other embodiments, a solder layer is placed on the second LED dies and on the contacts, remote from the reflective layer. In some embodiments, the plurality of contacts comprise a plurality of slugs according to any of the embodiments that were described above. Moreover, in some embodiments, an optically transparent structure is formed on the reflective layer. The optically transparent structure may be formed by forming an encapsulation layer on the reflective layer and placing a glass layer on the encapsulation layer.

After fabrication, the LED component may be mounted on a board along with other electronic components, wherein the LED component is free of a submount between the LED die and the board.

Finally, the method embodiments described above provided one wire bond per LED die. However, in other embodiments, two or more wire bonds may be provided per LED die. Thus, in some embodiments, the plurality of contacts comprise a plurality of first contacts and a plurality of second contacts, a respective one of which is adjacent but spaced apart from a respective one of the LED dies. Moreover, the wire bonding comprises wire bonding a respective LED die to a respective first contact and to a respective second contact. Finally, the singulating comprises singulating the respective LED die and the respective first and second contacts to provide the plurality of LED components.

BRIEF DESCRIPTION OF THE DRAWINGS

FIG. 8 is a cross-sectional view of an LED component according to various other embodiments described herein.

FIGS. 9A and 9B are cross-sectional views of slugs that may be used in an LED component according to various embodiments described herein.

FIGS. 10A and 10B, which are collectively referred to herein as FIG. 10, are a cross-sectional view and a top view, respectively, of a slug that may be used according to various embodiments described herein.

FIGS. 11A and 11B, which are collectively referred to herein as FIG. 11, are a cross-sectional view and a top view, respectively, of a slug that may be used according to various other embodiments described herein.

DETAILED DESCRIPTION

Figure 1:
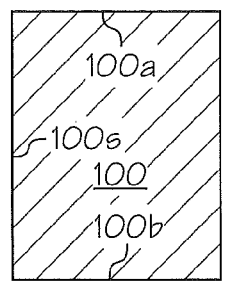
FIG. 1 is a cross-sectional view of an LED die according to various embodiments described herein.

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. The term "directly" means that there are no intervening elements. As used herein, the term "and/or" includes any and all combinations of one or more of the associated listed items and may be abbreviated as "/".

As used herein, a layer or region is considered to be "transparent" when at least 50% of the radiation that impinges on the transparent layer or region emerges through the transparent layer or region. Moreover, as used herein, a "rigid" structure is a stiff structure that is unable to bend or be forced out of shape; i.e., not flexible or pliant. A rigid structure may be subject to minimal bending without breaking, but bending beyond this minimal bending will break or deform a rigid structure. As also used herein, a "flexible structure" means a structure that is not rigid. In specific examples of materials used herein, glass is considered to be rigid, whereas silicone is considered to be flexible. Finally, as used herein, a "sheet" means a broad, relatively thin piece, plate or slab of material, such as glass.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Some embodiments now will be described generally with reference to gallium nitride (GaN)-based light emitting diodes on silicon carbide (SiC)-based growth substrates for ease of understanding the description herein. However, it will be understood by those having skill in the art that other embodiments of the present invention may be based on a variety of different combinations of growth substrate and epitaxial layers. For example, combinations can include AlGaInP diodes on GaP growth substrates; InGaAs diodes on GaAs growth substrates; AlGaAs diodes on GaAs growth substrates; SiC diodes on SiC or sapphire ($Al_2O_3$) growth substrates and/or a Group III-nitride-based diode on gallium nitride, silicon carbide, aluminum nitride, sapphire, zinc oxide and/or other growth substrates. Moreover, in other embodiments, a growth substrate may not be present in the finished product. For example, the growth substrate may be removed after forming the light emitting diode, and/or a bonded substrate may be provided on the light emitting diode after removing the growth substrate. In some embodiments, the light emitting diodes may be gallium nitride-based LED devices manufactured and sold by Cree, Inc. of Durham, N.C.

Some embodiments described herein can provide submount-free LED components that may be ready for mounting on a mounting board, such as a printed circuit board. The LED component includes one or more discrete LED dies and one or more discrete contacts that is spaced apart from the LED die. A wire bond extends between the LED die and the contact. A reflective layer extends between the contact and the LED die and also extends onto the contact and along the die sidewall.

Various embodiments described herein may arise from a recognition that, although useful for mounting LED dies, a submount may require additional processing complexity and/or cost, and may also impact the reliability of the LED component. In contrast, various embodiments described herein provide a contact that can be wire bonded, without the need for a submount.

FIG. 1 is a cross-sectional view of a Light Emitting Diode (LED) die, also referred to as an LED chip, according to various embodiments described herein. Various embodiments described herein may be used with many different configurations of LED dies. Accordingly, an LED die 100 is represented in FIG. 1 in a highly schematic manner. The LED die includes first and second opposing faces 100a, 100b, respectively, and a die sidewall 100s extending therebetween. It will be understood, however, that the LED die 100 will also include a diode region that may include therein an n-type layer and a p-type layer. Other layers or regions may be provided, which may include quantum wells, buffer layers, etc. An anode contact also is provided that ohmically contacts the p-type layer, either directly or by way of one or more conductive vias and/or other intermediate layers. A cathode contact also is provided that ohmically contacts the n-type layer, directly and/or by way of one or more conductive vias and/or other intermediate layers. The diode region may also be referred to herein as an "LED epi region", because it is typically formed epitaxially on a substrate. For example, a Group III-nitride-based LED epi region may be formed on a silicon carbide growth substrate. In some embodiments, the growth substrate may be present in the finished product. In other embodiments, the growth substrate may be thinned or may be removed. In still other embodiments, another substrate may be provided that is different from the growth substrate. In yet other embodiments, an Organic LED (OLED)

may be used. Moreover, the sidewall 120s may be orthogonal to the faces 110a/110b, or extend at an oblique angle relative to the faces 100a, 100b. In yet other embodiments, the sidewall 120s may be stepped, beveled, roughened, patterned and/or faceted.

The LED dies 100 may be configured as horizontal or lateral LEDs in which both the anode and cathode contacts thereof are provided on a single face of the LED die 100, or as vertical LEDs in which the anode and cathode contacts are provided on opposite faces thereof. In either case, whether horizontal or vertical, the LED die is configured so that a wire bond is used to connect the anode contact and/or the cathode contact to an external structure.

Horizontal LED dies that may be used with various embodiments described herein include the TR™ family of LED chips that is marketed by Cree, Inc., the assignee of the present application, and which is described, for example, in Data Sheets entitled "*Cree® TR2227™ LEDs Data Sheet Cxxx.TR2227-Sxx00*" (Data Sheet: CPR3EF Rev A, 2010); and "*TR3547™ LEDs CxxxTR3547-Sxx00 Data Sheet*" (Data Sheet: CPR3FJ Rev.-, 2011), the disclosures of which are hereby incorporated herein by reference in their entirety as if set forth fully herein. However, other horizontal LEDs that include topside anode and cathode contacts may also be used.

Moreover, various embodiments described herein may also be used with vertical LEDs, wherein the anode and cathode contacts are provided on opposite faces of the LED die 100. Vertical LEDs may be embodied by the EZ™ family of chips that is marketed by Cree, the assignee of the present application, and which is described, for example, in Data Sheets entitled "*Cree® EZ290™ Gen II LEDs Data Sheet: CxxxEZ290-Sxx00-2*" (Data Sheet: CPR3EJ, Rev-, 2010); "*Cree® EZ400™ Gen II LED Data Sheet: CxxxEZ400-Sxxx000-2*" (Data Sheet: CPR3ED, Rev-, 2009); "*Cree® EZ950™ Gen 3 LEDs Data Sheet: CxxxEZ950-Sxx000-3-x*" (Data Sheet: CPR3FW, Rev-, 2014); and "*Cree® EZ1000™ Gen II LEDs Data Sheet: CxxxEZ1000-Sxx000-2*" (Data Sheet: CPR3EC, Rev A, 2009), the disclosures of which are hereby incorporated herein by reference in their entirety as if set forth fully herein.

Vertical LEDs may also be embodied by the XThin® family of LEDs that is marketed by Cree, the assignee of the present application, and which is described, for example, in a Data Sheet entitled "*XThin® LEDs: CxxxXT290-Sxx00-A*" (Data Sheet: CPR3BV, Rev H, 2003-2006), the disclosure of which is hereby incorporated herein by reference in its entirety as if set forth fully herein. Vertical LEDs may also be embodied by the RazerThin® and UltraThin™ families of LEDs that is marketed by Cree, the assignee of the present application, and which is described, for example, in Data Sheets entitled "*RazerThin® Gen III LEDs: CxxxRT200-Sxxxx*" (Data Sheet: CPR3DS, Rev-, 2008); "*RazerThin® LEDs: CxxxRT230-S0200*" (Data Sheet: CPR3CO, Rev A, 2005-2006); "*RazerThin® Gen III LEDs: CxxxRT260-Sxxxx*" (Data Sheet: CPR3DT, Rev-, 2008); and "*Cree® UltraThin™ Gen III LEDs Data Sheet: CxxxUT190-Sxxxx-31*" (Data Sheet: CPR3EP, Rev A, 2010), the disclosures of which are hereby incorporated herein by reference in their entirety as if set forth fully herein. Vertical LEDs may also be embodied by the MegaBright® family of LEDs that is marketed by Cree, the assignee of the present application, and which is described, for example, in a Data Sheet entitled "*MegaBright® Generation II LEDs: CxxxMB290-Sxx00*" (Data Sheet: CPR3CK, Rev C, 2005-2006), the disclosure of which is hereby incorporated herein by reference in its entirety as if set forth fully herein. Vertical LEDs may also be embodied by the SuperBlue™ family of LEDs that is marketed by Cree, the assignee of the present application, and which is described, for example, in a Data Sheet entitled "*SuperBlue™ Generation II LEDs Preliminary Data Sheet: C430CB230-S2100*" (Data Sheet: CPR3DM, Rev-, 2008), the disclosure of which is hereby incorporated herein by reference in its entirety as if set forth fully herein. However, other vertical LEDs from other manufacturers may also be used, according to various embodiments described herein.

The LED dies may emit different colors of light and may include a luminophoric layer, such as a phosphor layer, thereon. For example, in some embodiments, the combination of white and red LED dies may be provided. Moreover, any number of multiple LED dies may be provided based on the requirements of the LED component. An LED die having a phosphor layer thereon in U.S. Patent Application Publication No. 2008/0179611 to Chitnis et al., entitled "Wafer Level Phosphor Coating Method and Devices Fabricated Utilizing Method", assigned to the assignee of the present application, the disclosure of which is hereby incorporated herein by reference in its entirety as if set forth fully herein.

Figure 2:
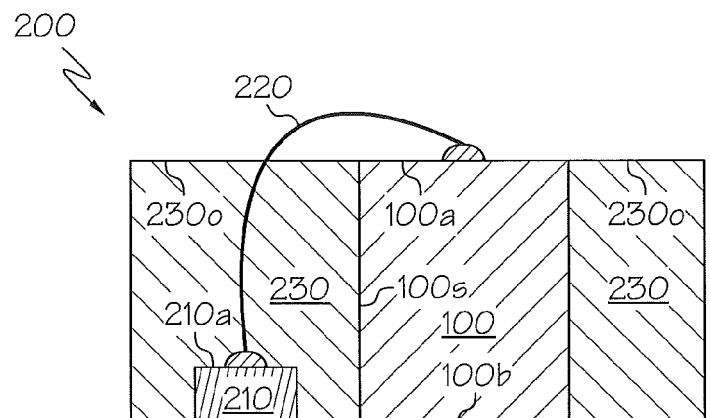
FIGS. 2-6 are cross-sectional views of LED components according to various embodiments described herein.

FIG. 2 is a cross-sectional view of an LED component according to various embodiments described herein. Referring to FIG. 2, the LED component 200 includes an LED die 100 having first 100a and second 100b opposing faces, and a die sidewall 100s extending therebetween. A contact 210 is provided that is spaced apart from the LED die 100. The contact 210 comprises an inner face 210a adjacent the first face 100a and an outer face 210b adjacent the second face 100b. A wire bond 220 extends between the first face 100a and the inner face 210a. A reflective layer 230 is provided on the inner face 210a and extends to the die sidewall 100s and also extends along the die sidewall 100s. The reflective layer 230 may comprise white paint in some embodiments. The white paint may comprise liquid silicone with titanium particles. In some embodiments the reflective layer 230 may include an outer surface 230o that is coplanar with the first face 100a. In some embodiments, although coplanar, the outer surface 230o of the reflective layer 230 may exhibit some dishing, for example as a result of the manufacturing processes that are used.

Figure 3:
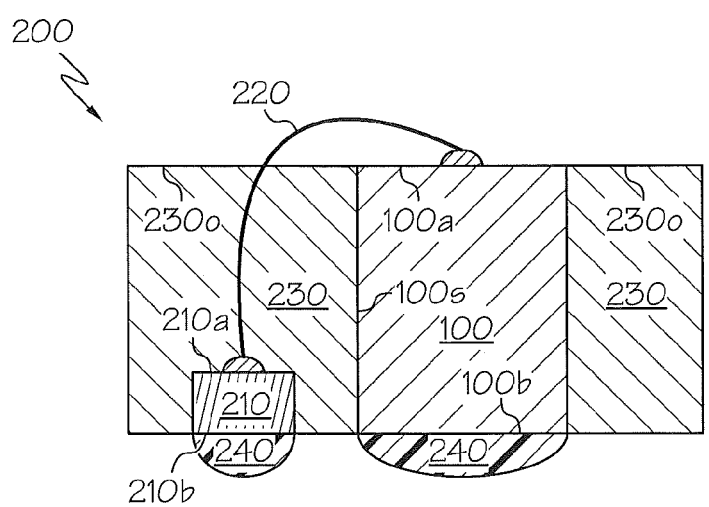

Referring to FIG. 3, in other embodiments, a solder layer 240 is provided on the outer face 210b of the contact 210. In yet other embodiments, the solder layer 240 may also be provided on the second face 100b of the LED die, as illustrated in FIG. 3.

The solder layer 240 may include preforms, solder bumps, solder balls and/or any other solder structure that is used in microelectronic technology. More specifically, the solder layer 240 may comprise eutectic gold/tin solder, tin solder bump, solder paste and/or solder preform, and may also include other solder compositions, such as lead/tin solders, tin/silver/copper solders, known as "SAC" solder and/or other solder configurations.

Figure 4:
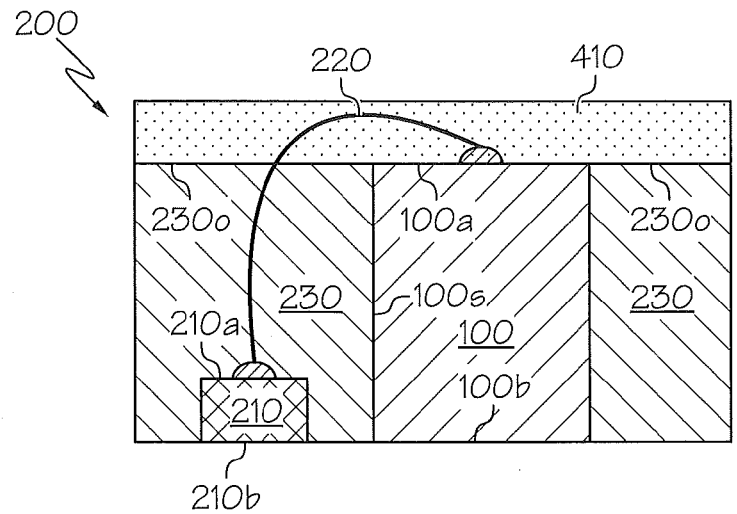

Referring to FIG. 4, in some embodiments, a layer 410 comprising luminophoric material may be provided on the first face 100a of the LED die 100 and, in some embodiments, may also extend on the outer face 230o of the reflective layer 230. In these embodiments, the reflective layer 230 does not extend onto the first face 100a of the LED die 100. It will be understood that, in some embodiments, the reflective layer 230 may extend only partially along the die sidewall 100s and the layer 410 comprising luminophoric material may also extend only partially along the die sidewall 100s. Either or both of the reflective layer 230 and the layer 410 comprising luminophoric material may extend conformally along the die sidewall 100s.

Figure 5:
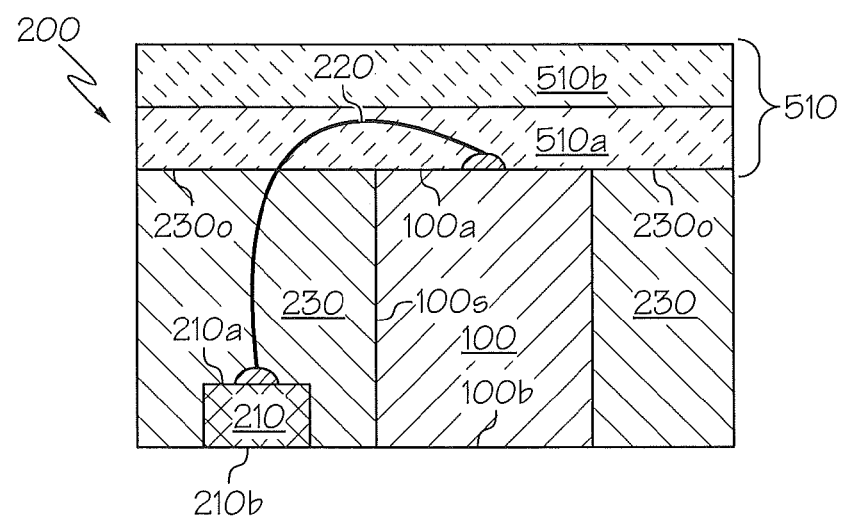

FIG. 5 illustrates other embodiments that further comprise an optically transparent structure 510 on the reflective layer 230 and on the first face 100a of the LED die 100. In some embodiments, as illustrated in FIG. 5, the optically transparent structure 510 comprises an encapsulation layer 510a on the reflective layer 230 and on the first face 100a, and a glass layer 510b on the encapsulation layer 510a remote from the reflective layer 230 and the first face 100a. An encapsulation layer with a glass sheet is described in detail in U.S. patent application Ser. No. 14/289,305 to Andrews et al. entitled "Multiple Die Light Emitting Diode (LED) Components and Methods of Fabricating Same", assigned to the assignee of the present application, the disclosure of which is hereby incorporated herein by reference in its entirety as if set forth fully herein. In some embodiments, a wafer or other carrier that includes a large number of the LED dies 100 thereon can be dammed at the periphery thereof and filled with silicone or other material and then cured. In still other embodiments, injection molding may be used to mold a lens on the layer comprising luminophoric material. In yet other embodiments, a lens may be formed by dispensing a drop (a glob) of liquid silicone on the individual LED dies (in wafer form or after singulation) which is then hardened to provide a lens. In any of these embodiments, the layer 410 comprising luminophoric material may not be provided. In addition or alternatively, luminophoric material such as phosphor may also be included in the optically transparent structure 510.

Figure 6:
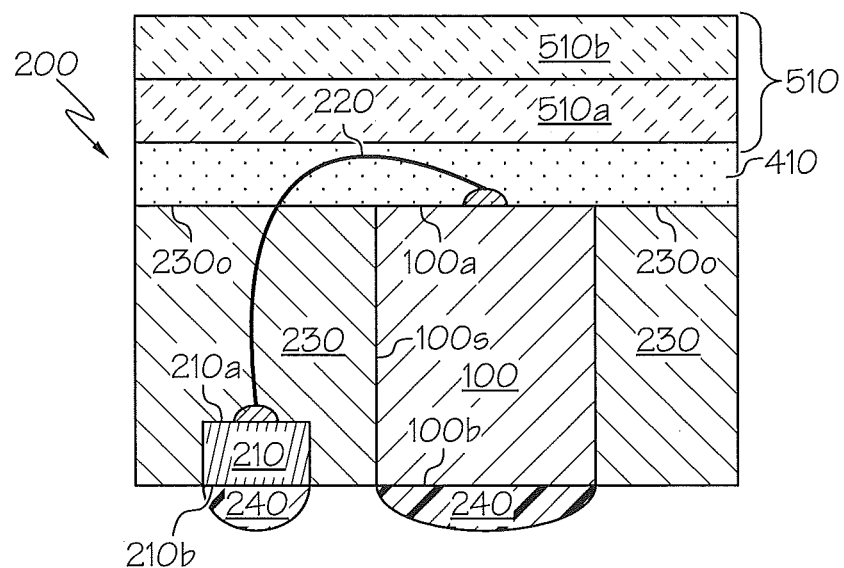
Figure 7:
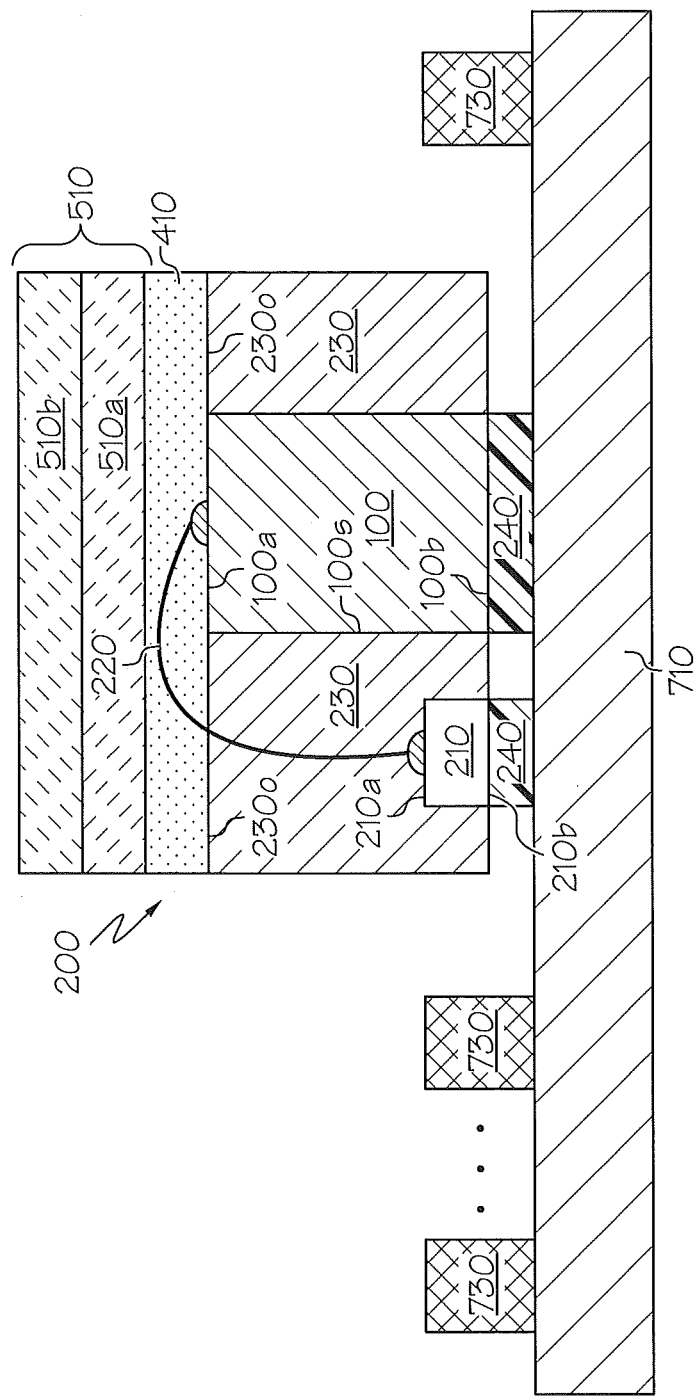
FIG. 7 is a cross-sectional view of an LED component of FIG. 6 mounted on a board according to various embodiments described herein.

Various embodiments of FIGS. 2-5 may be used in various combinations and subcombinations. For example, FIG. 6 illustrates an embodiment wherein a solder layer 240 of FIG. 3, a luminophoric layer 410 of FIG. 4 and an optically transparent structure 510 of FIG. 5 are all used. However, various other combinations and subcombinations of the solder layer 240, luminophoric layer 410 and/or transparent structure 510 may be used. As illustrated in FIG. 7, any of the embodiments described herein may be provided on a board 710 along with other electronic components 730, wherein the LED component 200 is free of a submount between the LED die 100 and the board 710. The LED component 200 may be connected to the board 710 by soldering the solder layer 240 to pads on the board 710. The board 710 may comprise a printed circuit board, multilayered printed wiring board, flexible circuit board, etc., and the pads may be provided by metal traces that are on the surface of the board 710.

Embodiments that were illustrated in FIGS. 2-7 included a single wire bond 220 that extends between the first face 100a of the LED die 100 and the inner face 210a of the contact 210. However, in any of these embodiments, the contact 210 may be a first contact and the wire bond 220 may be a first wire bond. As illustrated in FIG. 8, the LED component 200 may further comprise a second contact 210' that is spaced apart from the LED die 100 and from the first contact 210. The second contact 210' also comprises an inner face 210a' adjacent the first face 100a and an outer face 210b' adjacent the second face 100b. A second wire bond 220' extends between the first face 100a and the inner face 210a' of the second contact 210'. The reflective layer 230 also extends on the inner face 210a' of the second contact. The two-wire bond embodiments of FIG. 8 may be combined with any of the other embodiments described herein.

Various embodiments of a contact 210, 210' may be provided according to various embodiments described herein, as will now be described. In some embodiments, the contact 210, 210' comprises a slug, i.e., a discrete lump of material, such as a copper slug. In other embodiments, as shown in FIG. 9A, the slug 900 may comprise a copper slug 910 having a reflective metal layer 920 on opposing faces thereof. For example, in some embodiments, the slug 900 may comprise a relatively thick copper slug 910 having thickness of between about 0.1 mm and about 0.75 mm, and the reflective metal layer 920 may be a silver plated layer, having a thickness of between about 0.2 µm and about 1 µm. In other embodiments, as shown in FIG. 9B, the slug 900 may comprise a wire that has been flattened on two opposing sides, for example by drawing through a rolling press, to flatten the circular cross-section into an oval-like cross-section having flattened sides. The wire may comprise bare copper, or may be plated with a thin layer of gold and/or silver. The rolled wire may be strung across a plurality of LED dies on a carrier using a loom-type fixture, so as to resemble a lead frame, and/or can be chopped into slugs, as was illustrated in FIG. 9B. The size of the slugs may be the same as was described above in connection with FIG. 9A.

FIGS. 10A and 10B are a cross-sectional view and a top view, respectively, of a contact 210, 210' according to other embodiments described herein. As shown, the contact 210 may be a slug 1000 that comprises an insulating body 1010, a conductive layer 1020 on opposing faces thereof, and a conductive via 1030 that extends in the insulating body 1010 to electrically connect the conductive layers 1020 on the opposing faces of the slug 1000. In other embodiments, as illustrated in FIGS. 11A and 11B, the conductive via 1030 may extend on the insulating body 1010, for example by providing an indentation or castellation in the body 1010 for the conductive via 1130. For example, in some embodiments, the insulating body 1010 may be a printed circuit board that comprises FR4 and/or other conventional printed circuit board materials, or may be a ceramic ($Al_2O_3$) slug 1010 that can be reflective. The via 1030/1130 may comprise copper and the conductive layers 1020 may comprise copper. A thin adhesion and/or plating seed layer comprising, for example, titanium, may also be provided in some embodiments.

Embodiments of FIGS. 10 and 11 may provide particularly low cost embodiments, as slugs like those illustrated may be readily available in the microelectronics industry. The slugs of FIGS. 10 and 11 may be particularly low cost, as they are widely used in microelectronic fabrication and the insulating material may be less expensive than a solid copper slug of FIG. 9A or 9B. It will be understood that the slugs of FIG. 9A-11 may be used in any of the embodiments described herein.

Figure 12A:
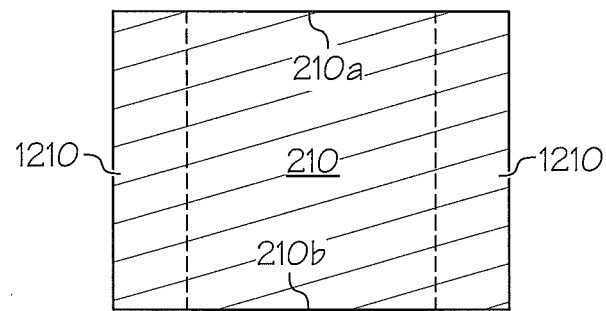
FIGS. 12A and 12B, which are collectively referred to herein as FIG. 12, are a cross-sectional view and a top view, respectively, of a lead frame contact that may be used according to still other embodiments described herein.
Figure 12B:
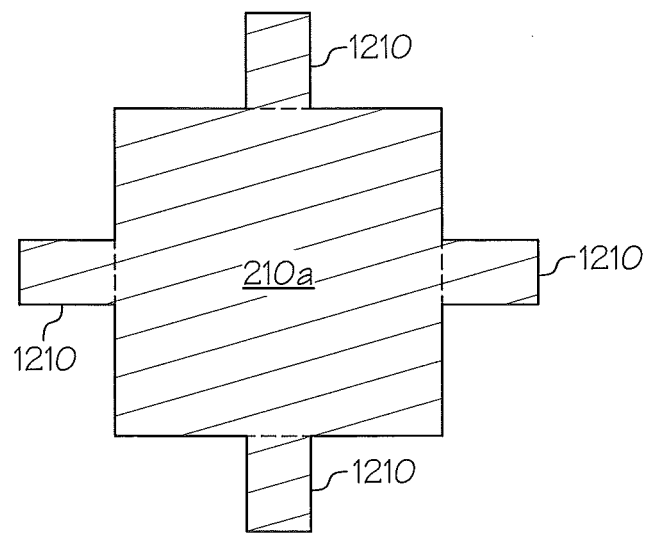

FIGS. 12A and 12B illustrate a contact 210 according to yet other embodiments described herein. In these embodiments, the contact 210 may comprise a portion of a lead frame, as will be described in detail below. The contact includes one or more tabs 1210 that extend therefrom and which may be used to connect adjacent contacts in the contact lead frame, as will be described below.

In some embodiments, the lead frame may comprise a patterned copper-based sheet that is about 100 µm thick in some embodiments, between about 50 µm and about 100 µm thick in other embodiments, and between about 100 µm and about 400 µm thick in still other embodiments. In some embodiments, the copper-based sheet may comprise copper, alloys of copper and/or copper with a solderable metal on the surface, such as electroless or electroplated silver plating, which may or may not include an intermediate layer, such as nickel. In other embodiments, the solderable metal may comprise tin, nickel/tin, SAC (Sn/Ag/Cu), lead/tin, gold/tin, gold and/or other solderable metal. Moreover, multilayer lead frames may be provided in still other embodiments that may include, for example, a core layer of aluminum and outer layers of copper-based materials and/or other materials.

Figure 13:
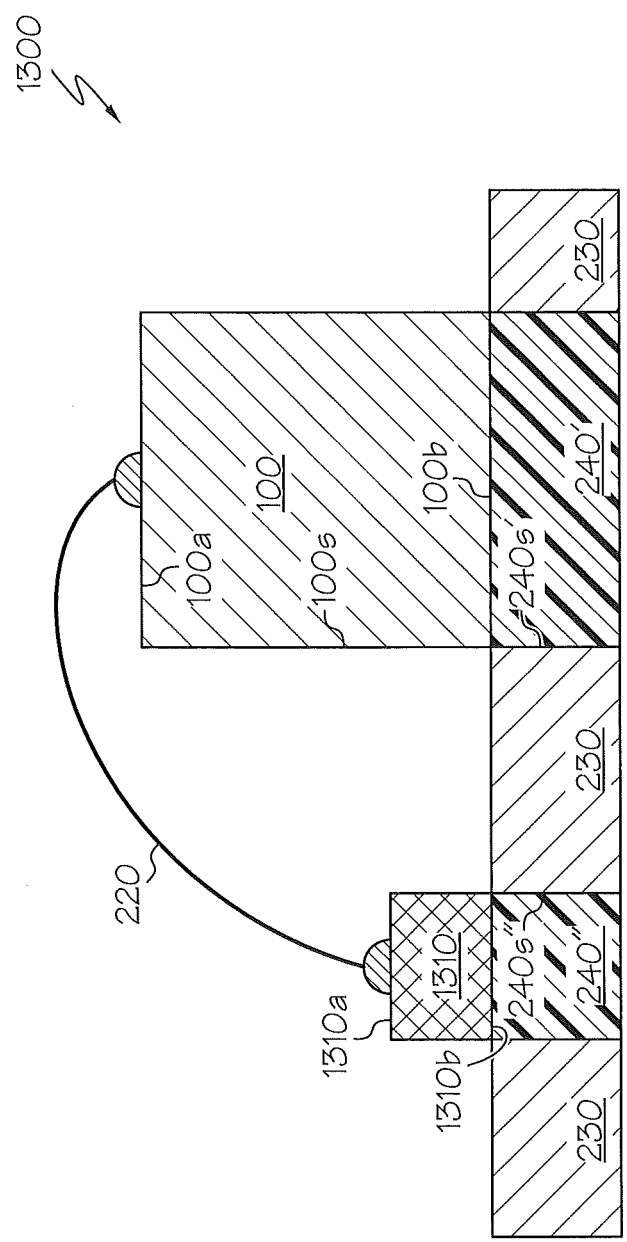
FIGS. 13-15 are cross-sectional views of LED components according to still other embodiments described herein.

FIG. 13 is a cross-section of an LED component according to other embodiments described herein. Referring to FIG. 13, these LED components 1300 include an LED die 100 that comprises first 100a and second 100b opposing faces and a die sidewall 100s extending therebetween. A slug 1310 is also provided that is spaced apart from the LED die 100. The slug 1310 comprises an inner face 1310a adjacent the first face 100a and an outer face 1310b adjacent the second face 100b. The slug may be provided according to any of the embodiments that were described above in connection with FIGS. 9A-12. A wire bond 220 extends between the first face 100a and the inner face 1310a. A first solder structure 240' is provided on the second face 100b and includes a first solder structure sidewall 240s'. A second solder structure 240'' is provided on the outer face 1310b and includes a second solder structure sidewall 240s'' that faces the first solder structure sidewall 240s'. A reflective layer 230, which may comprise white paint, is provided that extends between the first solder structure sidewall 240s' and the second solder structure sidewall 240s''.

Figure 14:
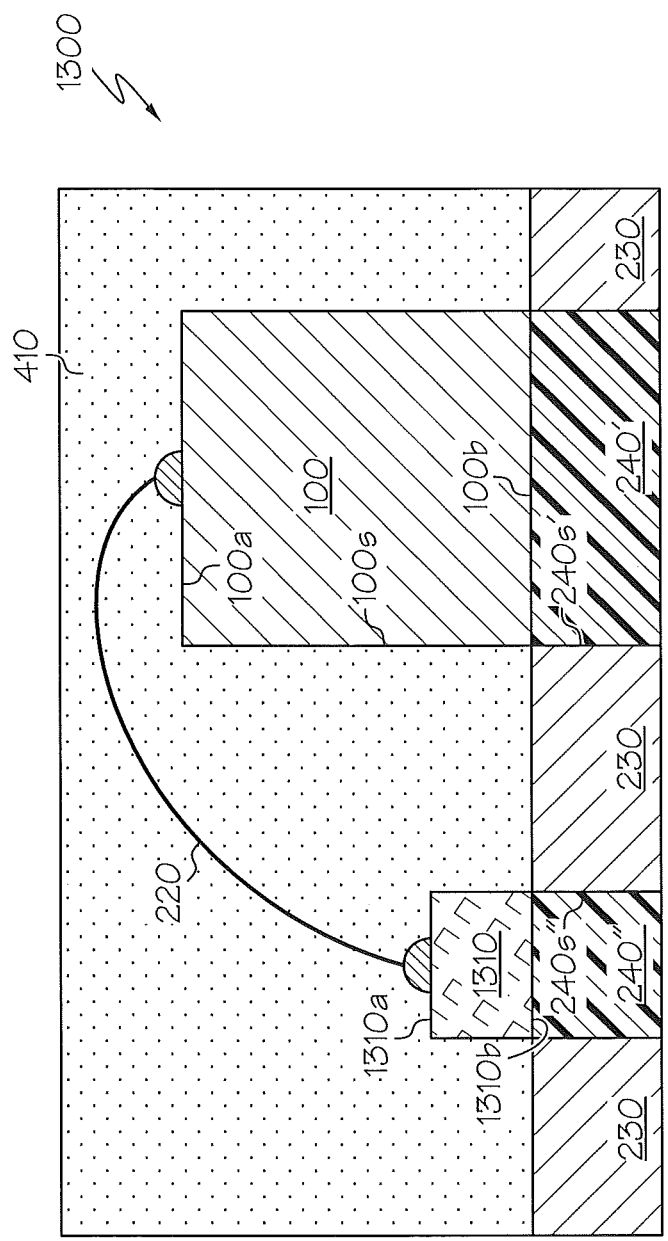

FIG. 14 illustrates other embodiments wherein a layer 410 comprising luminophoric material is provided on the first face 100a, on the die sidewall 100s, on the reflective layer 230 and on the inner face 1310a of the component of FIG. 13. The layer 410 may be formed conformally or, as shown in FIG. 14, may be blanket deposited over the outer surfaces of the entire LED component 1300. In other embodiments, the layer 410 may not extend on the first face 100a. Moreover, in other embodiments, an optically transparent structure, as was illustrated in FIGS. 5 and 6, may be provided, and the LED component may be mounted on a board, as was illustrated in FIG. 7.

Figure 15:
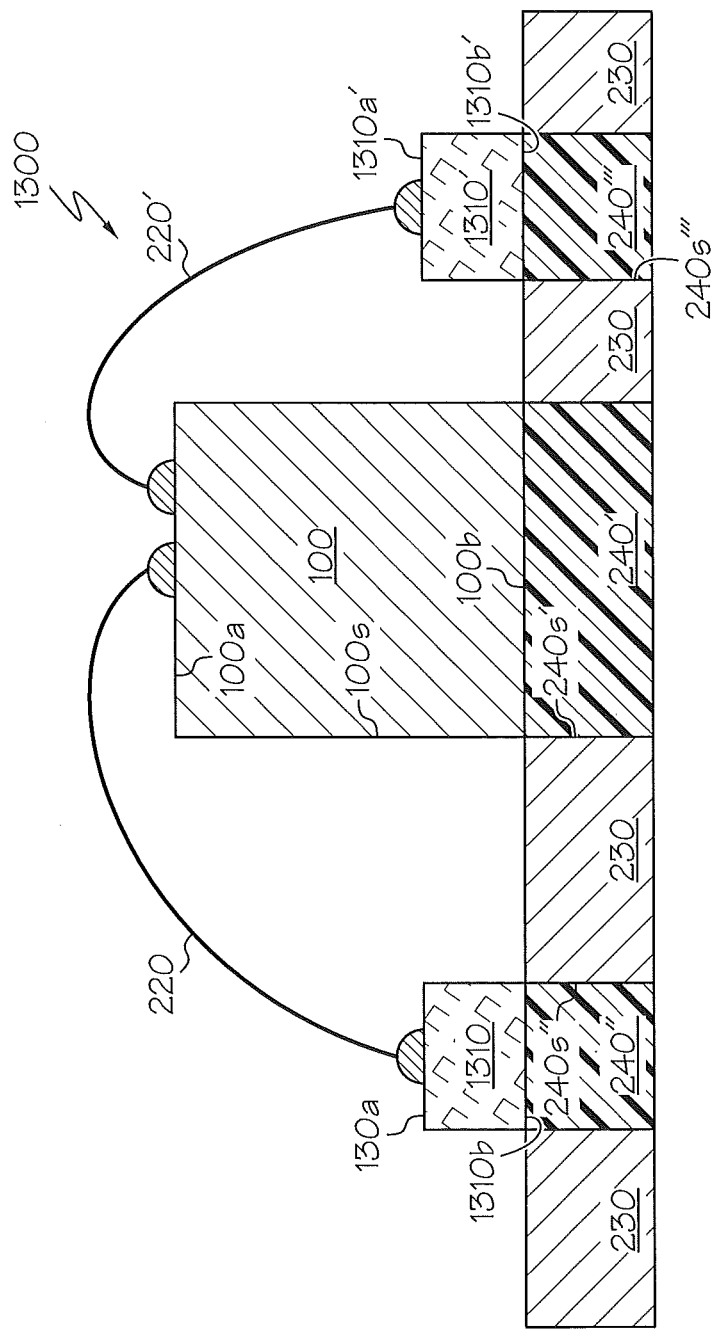

In yet other embodiments, as illustrated in FIG. 15, two wire bonds may be provided. Specifically, as illustrated in FIG. 15, the slug 1310 is a first slug and the wire bond 220 is a first wire bond, and the LED component 1300 further comprises a second slug 1310' that is spaced apart from the LED die 100 and the first slug 1310. The second slug 1310' also includes an inner face 1310a' adjacent the first face 100a, and an outer face 1310b' adjacent the second face 100b. A second wire bond 220' extends between the first face 100a and the inner face 1310a' of the second slug 1310'. A third solder structure 240' is provided on the outer face 1310b' of the second slug 1310' and includes a third solder structure sidewall 240s''' that faces the first and/or second solder structure sidewalls 240s' and/or 240s''. The reflective layer 230 also extends between the third solder structure sidewall 240s''' and the first and/or second solder structure sidewalls 240s'/240s''. These two-wire bond embodiments may also be combined with any of the other embodiments that were previously described, including providing a layer comprising luminophoric material, providing various embodiments of the contacts, providing an optically transparent structure and/or mounting on a board.

Figure 16:
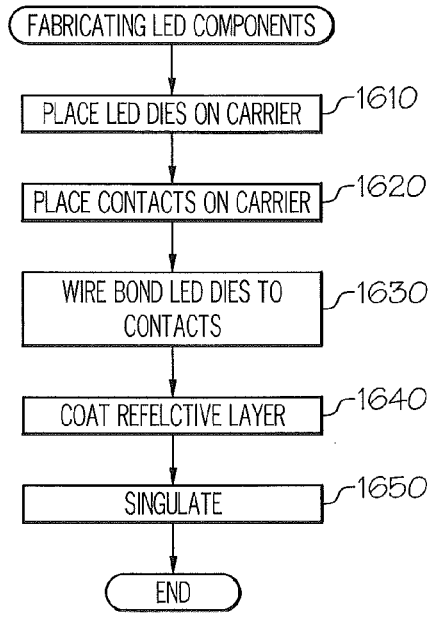
FIGS. 16-18 are flowcharts of operations that may be performed to fabricate LED components according to various embodiments described herein.

FIG. 16 is a flowchart of operations that may be performed to fabricate an LED component according to various embodiments described herein. Referring now to FIG. 16, at Block 1610, a plurality of LED dies, such as any of the LED dies 100 described above, are placed on a carrier, such as a carrier tape. In some embodiments, the carrier may be embodied as a multilayer carrier sheet, including a bottom rigid layer, a Thermal Release (TR) intermediate layer, and a top ultraviolet curable layer as was described in the above-cited U.S. patent application Ser. No. 14/289,305.

At Block 1620, a plurality of contacts, such as any of the contacts 210, 210', 900, 1000, 1310 and/or 1310' described above, are placed on the carrier, a respective one of which is adjacent but spaced apart from a respective one of the LED dies 100. It will be understood that the operations of Blocks 1610 and 1620 may be performed out of the order shown, such that the contacts are first placed on the carrier and the LED dies are then placed on the carrier, and/or may be interleaved, such as LED dies and contacts are placed on the carrier in an alternating manner.

Then, at Block 1630, a respective LED die is wire bonded to a respective contact. At Block 1640, a reflective layer, such as the reflective layer 410 described above, is coated on the plurality of LED dies and on the plurality of contacts that are wire bonded. At Block 1650, the respective LED die and the respective contact are singulated to provide a plurality of LED components. It will be understood that singulation may take place by singulating individual LED dies and their associated individual contacts, or groups of LED dies and their associated contacts may be singulated to provide an LED component that includes a plurality of LED dies that are connected in series and/or in parallel, as was described, for example, in U.S. patent application Ser. No. 14/325,047 to Andrews entitled "Light Emitting Diode (LED) Components Including Contact Expansion Frame and Methods of Fabricating Same", assigned to the assignee of the present application, the disclosure of which is hereby incorporated herein by reference in its entirety as if set forth fully herein. The carrier may be removed prior to or after singulation. Moreover, when the plurality of contacts comprise a portion of a lead frame, the singulating may include singulating the lead frame.

Figure 17:
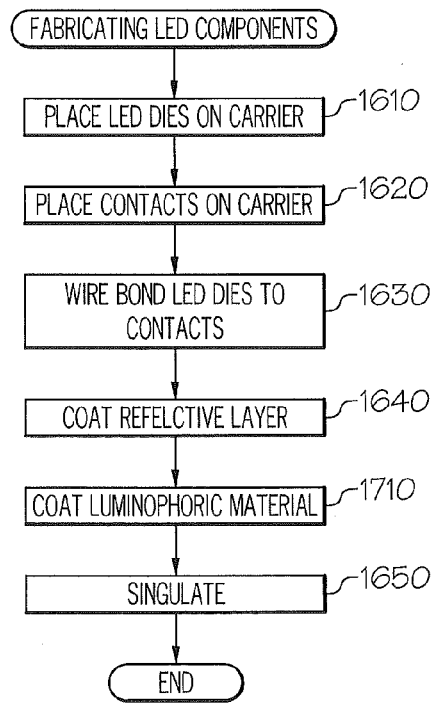

FIG. 17 is a flowchart of operations that may be performed to fabricate LED components according to various other embodiments described herein. Referring now to FIG. 17, the operations of Blocks 1610-1640 are performed. Then, at Block 1710, a layer comprising luminophoric material, such as the layer 410 described above, is coated on the reflective layer.

Figure 18:
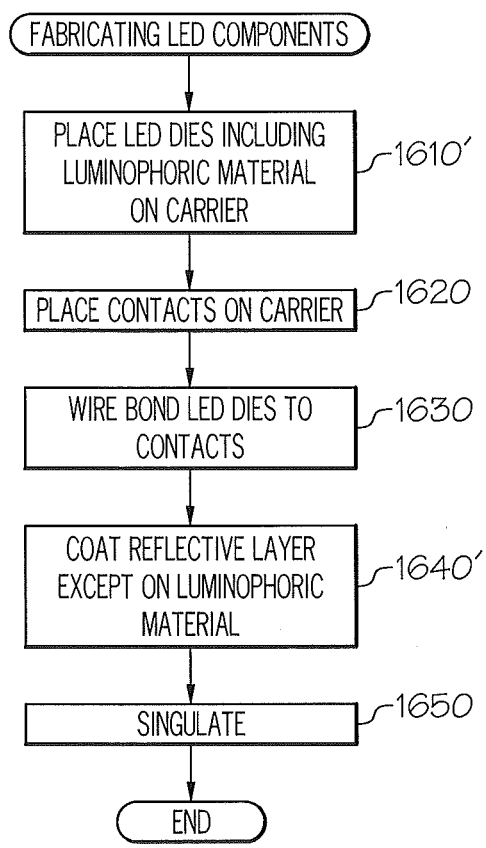

FIG. 18 is a flowchart of operations that may be performed to fabricate LED components according to various other embodiments described herein. In these embodiments, the LED dies that are placed on the carrier at Block 1610' already include luminophoric material thereon. For example, white LED dies that comprise a blue LED with a layer of luminophoric material thereon, may be used. The layer comprising luminophoric material may be provided on the exposed top faces of the LED dies, but not on the sidewalls thereof. Operations of Block 1620 and 1630 are performed. Then, at Block 1640', the reflective layer is coated on the sidewalls of the plurality of LED dies and on the plurality of contacts that are wire bonded, but not on the layer comprising luminophoric material. Singulation takes place at Block 1650.

In any of the method embodiments of FIGS. 16-18, a solder layer, such as the solder layer 240, 240', 240'' and/or 240''' described above, may be formed on the LED dies and on the contacts, remote from the reflective layer. As will be described below, in some embodiments, the solder layer and the reflective layer may be coplanar, and the solder layer may be placed before or after the reflective layer. Moreover, the plurality of contacts may comprise a plurality of slugs according to any of the embodiments described herein. An optically transparent structure may also be provided prior to singulation, according to any of the embodiments described herein. Moreover, after singulation, the LED component may be mounted on a board along with other electronic components, wherein the LED component is free of a submount between the LED die and a board. Finally, in any of the above-described embodiments of FIGS. 16-18, the plurality of contacts may comprise a plurality of first contacts and a plurality of second contacts, a respective one of which is adjacent but spaced apart from the adjacent one of the LED dies. Then, the wire bonding of Block 1630 may comprise wire bonding a respective LED die to a respective first contact and to a respective contact, and the singulating of Block 1650 may comprise singulating the respective LED die and the respective first and second contacts to provide a plurality of LED components.

Figure 19:
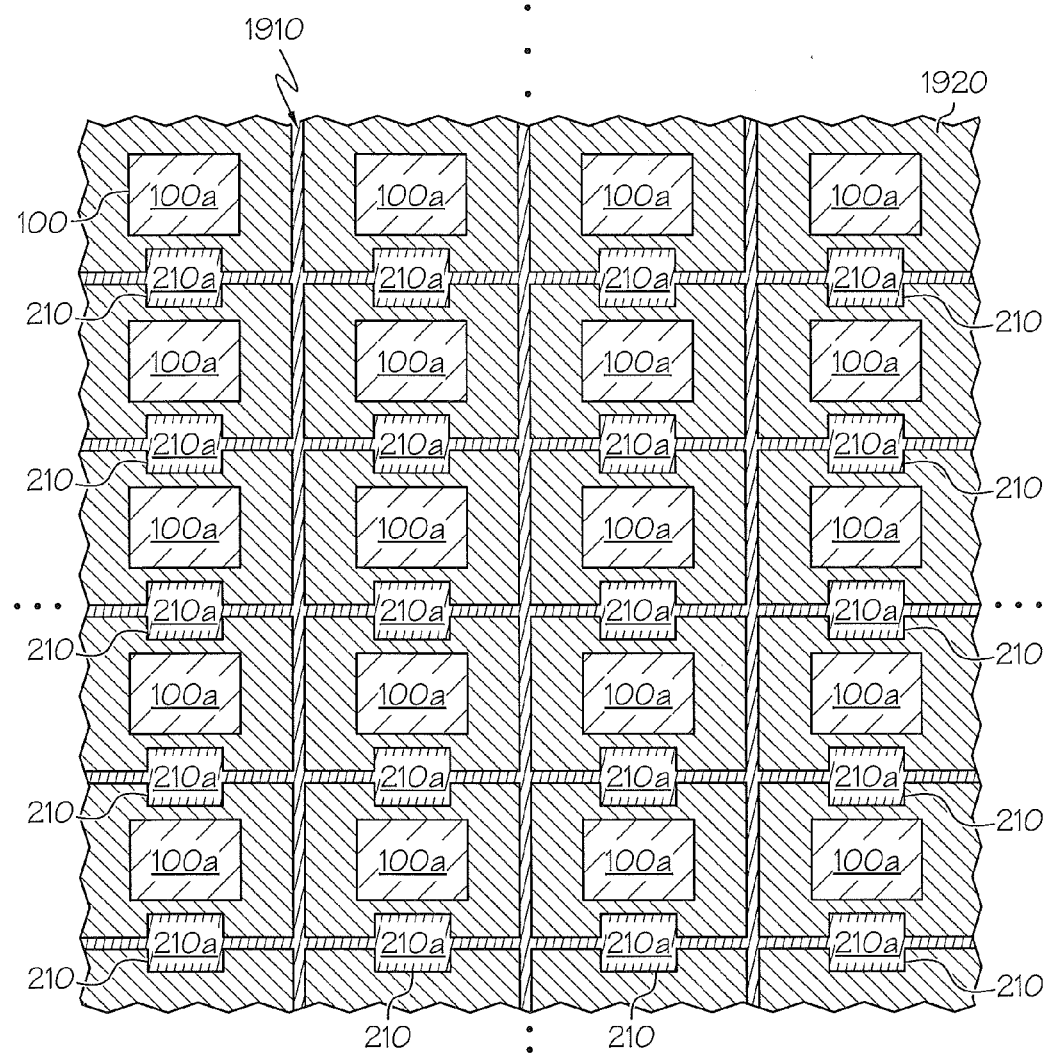
FIGS. 19-24 are top views of a plurality of LED components during fabrication thereof according to various embodiments described herein.

FIG. 19 is a top view of a plurality of LED components during fabrication according to various embodiments described herein. In embodiments of FIG. 19, an LED component as was illustrated in FIG. 6 may be fabricated using a lead frame, a portion of which was illustrated in FIGS. 12A and 12B. FIG. 19 assumes that a plurality of LED components will be made using a vertical LED die having, for example, a GaN-based LED epi on a conductive nontransparent silicon substrate with a mirror layer between the LED epi and the conductive nontransparent silicon substrate. The LED die includes a first contact on an outer face of the epi layer, and a second contact is provided on the outer face of the silicon substrate. These LEDs may be embodied by the EZ family of LEDs that were described above.

Referring to FIG. 19, a plurality of LED dies 100 and a plurality of contacts 210 are placed on a carrier 1920, as was described in connection with Blocks 1610 and 1620. Since FIG. 19 is a top view, the first face 100a of the LED dies 100 and the inner face 210a of the contacts are illustrated. The placing of the lead frame 1910 and the LED dies 100 is such that a respective LED die 100 is adjacent but spaced apart from a respective contact 210. As also illustrated, the contacts 210 are part of a lead frame 1910, so that they may be connected and provided on the carrier tape as a single structure. The carrier tape 1920 may itself be formed on a substrate carrier, such as a glass wafer. As was already described in connection with Blocks 1610 and 1620, the LED dies 100 may be placed on the carrier 1920 before the contacts 210, or the lead frame 1910 including the contacts 220 may be placed on the carrier 1920 before the LED dies 100. Pick and place techniques may be used.

Figure 20:
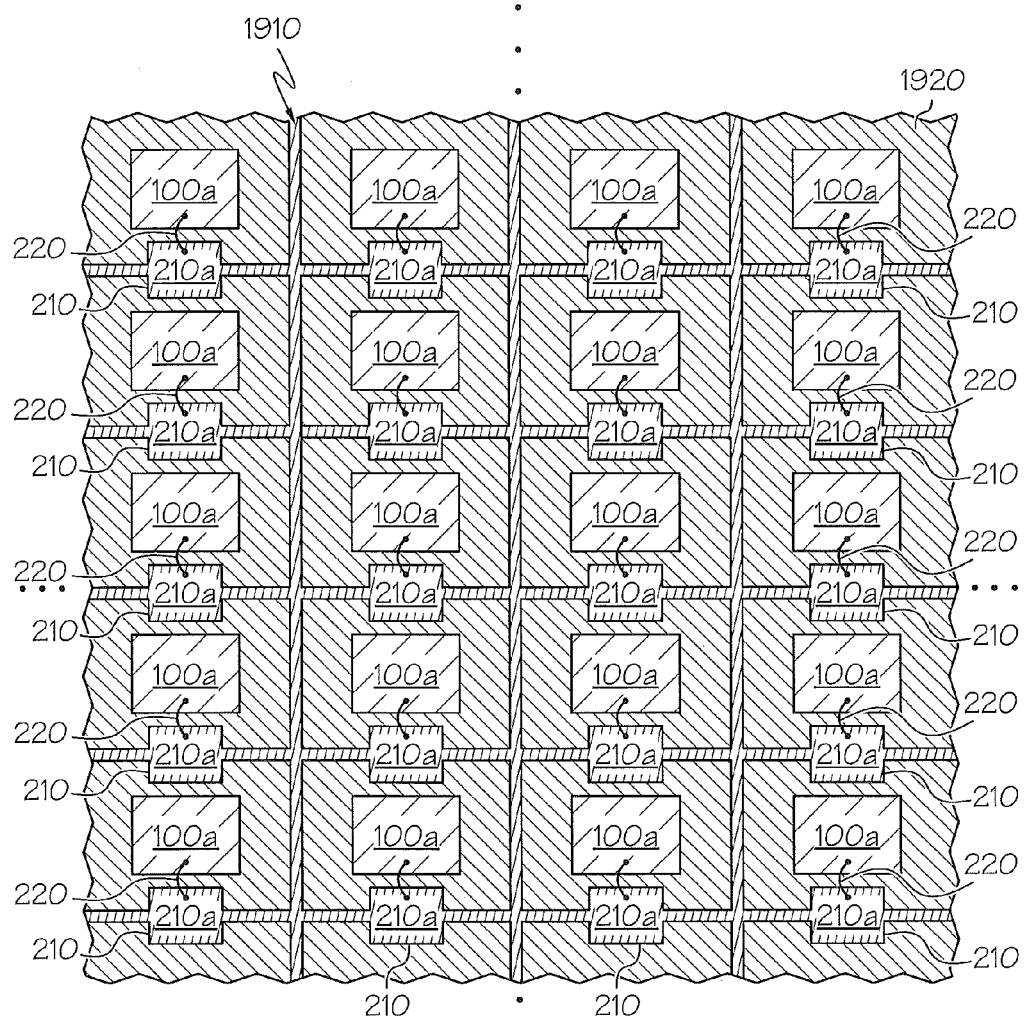

Referring now to FIG. 20, respective LED die 100 is wire bonded to a respective contact 210, as was described in connection with Block 1630.

Figure 21:
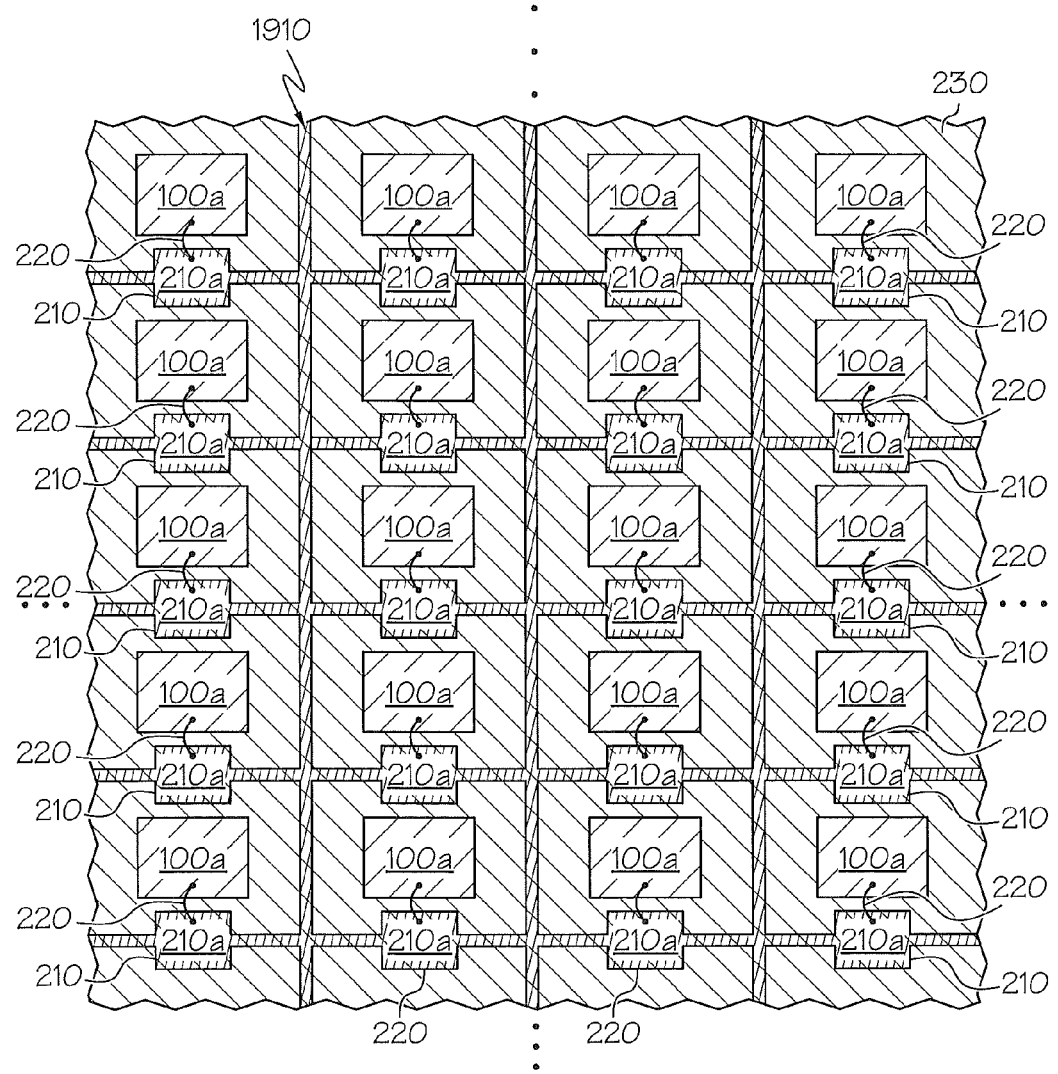

Then, referring to FIG. 21, the reflective layer 230 is applied on the plurality of LED dies 100 and on the plurality of LED contacts 210 that are wire bonded, as was described in connection with Blocks 1640 and 1640'. As illustrated in FIG. 21, in some embodiments, the first face 100a of the LED dies 100 are not covered by the reflective layer 230. In fact, as was already described in connection with FIG. 2, the outer surface of the reflective layer 230 may be coplanar with the top surface 100a of the LED dies. The reflective layer 230 may not be applied to the LED dies 100, because the reflective layer 230 would reflect light that is emitted from the LED die 100 back into the LED die 100.

Various techniques may be used to apply the reflective layer 230 as illustrated in FIG. 21. For example, horizontal and vertical lines of white paint may be applied between the LED dies 100 and then allowed to wick, so that the white paint wicks onto the sidewalls 100s of the LED dies. The amount of white paint that is applied may be controlled, so that the white paint does not wick onto the first faces 100a of the LED dies 100. The surface tension of the wicking may cause some dishing of the outer surface of the reflective layer 230 between the LED dies 100, as was already explained in connection with FIG. 2. In other embodiments, screen printing may be used to apply the reflective layer. In yet other embodiments, the reflective layer 230 may be sprayed on the entire exposed surface and then polished to expose the first faces 100a of the LED dies 100. Other techniques may be used.

Figure 22:
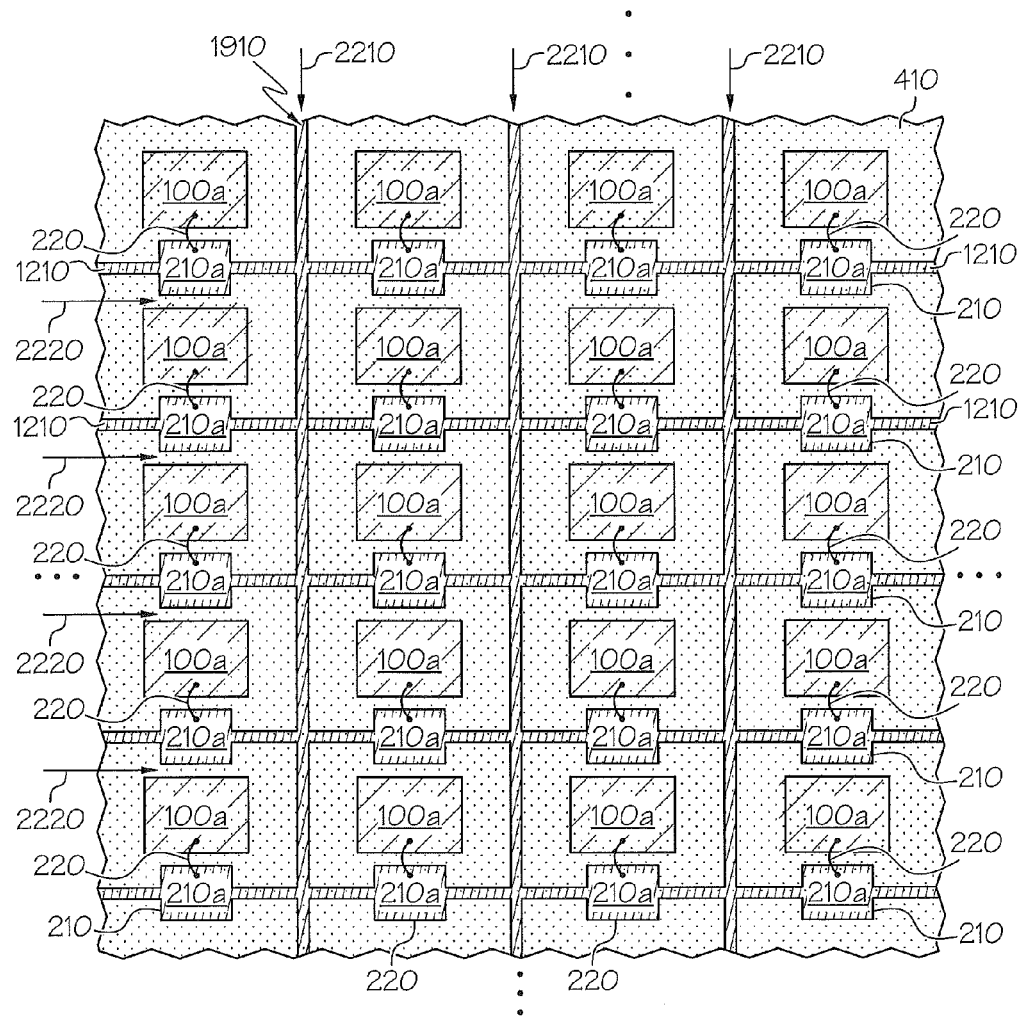

Then, referring to FIG. 22, a layer 410 comprising luminophoric material is provided on all of the exposed surfaces of the carrier tape, as was described in connection with Block 1710. An encapsulation layer may then be formed, followed by a glass sheet, as was illustrated in FIG. 5. The devices are then singulated as was described in connection with Block 1650, for example by sawing along the vertical lines of the lead frame 1910, as indicated by arrows 2210 and also sawing horizontally between the horizontal lines of the lead frame 1910 and the LED die 100 that is not bonded to the contact 220 that is adjacent thereto, as illustrated by the horizontal arrows 2220 in FIG. 22. The carrier tape may be removed prior or after singulation. Groups of dies may also be singulated to provide high voltage and/or high current components.

After singulation, portions of the lead frame 1910, for example to the left and right of a given contact 210, may remain and form tabs 1210 that were illustrated in FIGS. 12A and 12B. These tabs 1210 may provide an indication that lead frames 1910 according to various embodiments described herein were employed.

After singulation, a solder layer 240 may be applied to the outer face 210b of the contact 210, and to the contact on the second face 100b of the LED die, as was described in connection with FIG. 6. The LED component may then be mounted on a board, as was illustrated in FIG. 7.

In other embodiments, the lead frame 1910 that is applied to the carrier tape 1920 in FIG. 19 may also include a second array of contacts to which the second faces 100b of LED dies 100 are bonded. When the second faces 100b of the LED dies 100 include an electrical contact (anode or cathode), bonding may take place using solder or other conductive die attach materials. When the bonding is strictly for thermal purposes but not for electrical purposes, epoxy may be used for this bond, rather than metal or electrically conductive materials. Thus, for example, when a sapphire substrate is used, epoxy may be used for the thermal or neutral bond.

In yet other embodiments, a luminophoric layer 410 may be applied before applying the reflective layer 230. Stated differently, the operations of FIG. 22 may be performed before the operations of FIG. 21, as will now be described.

Figure 23:
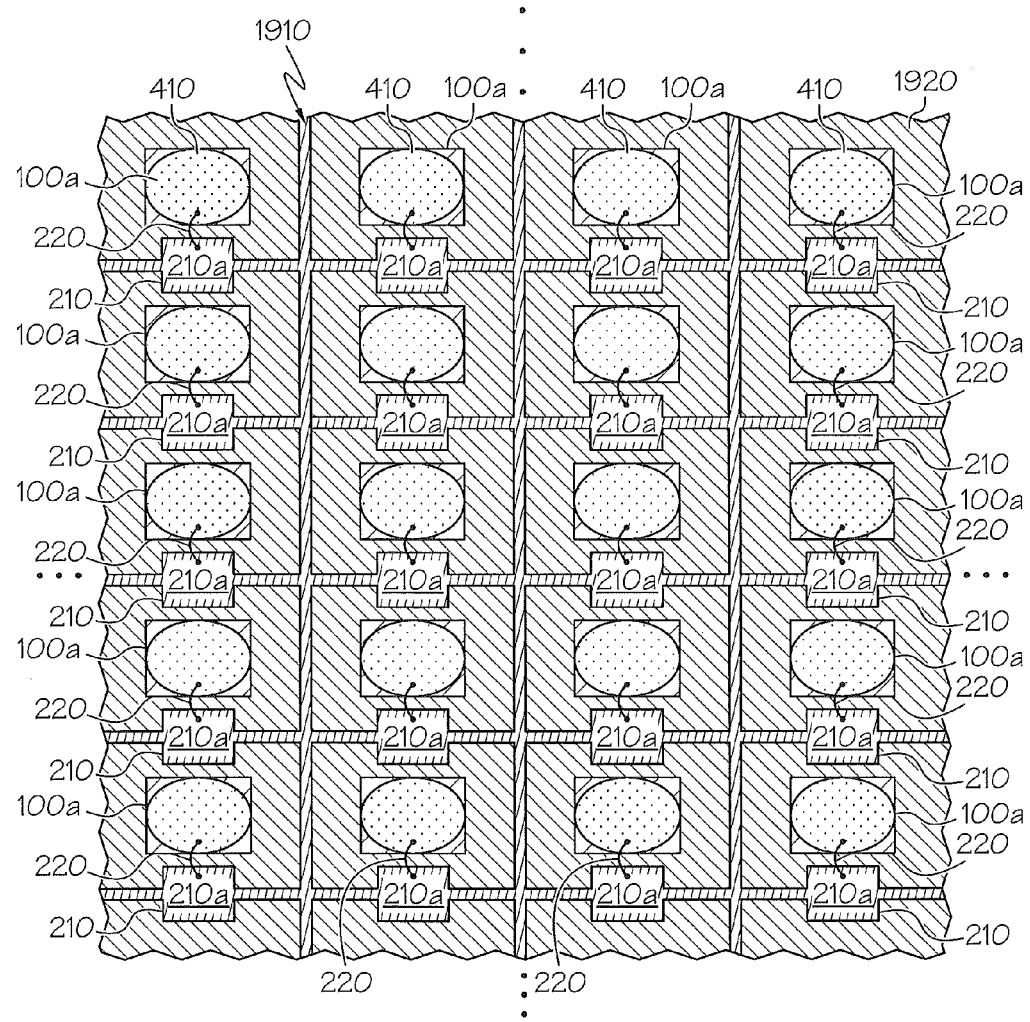
Figure 24:
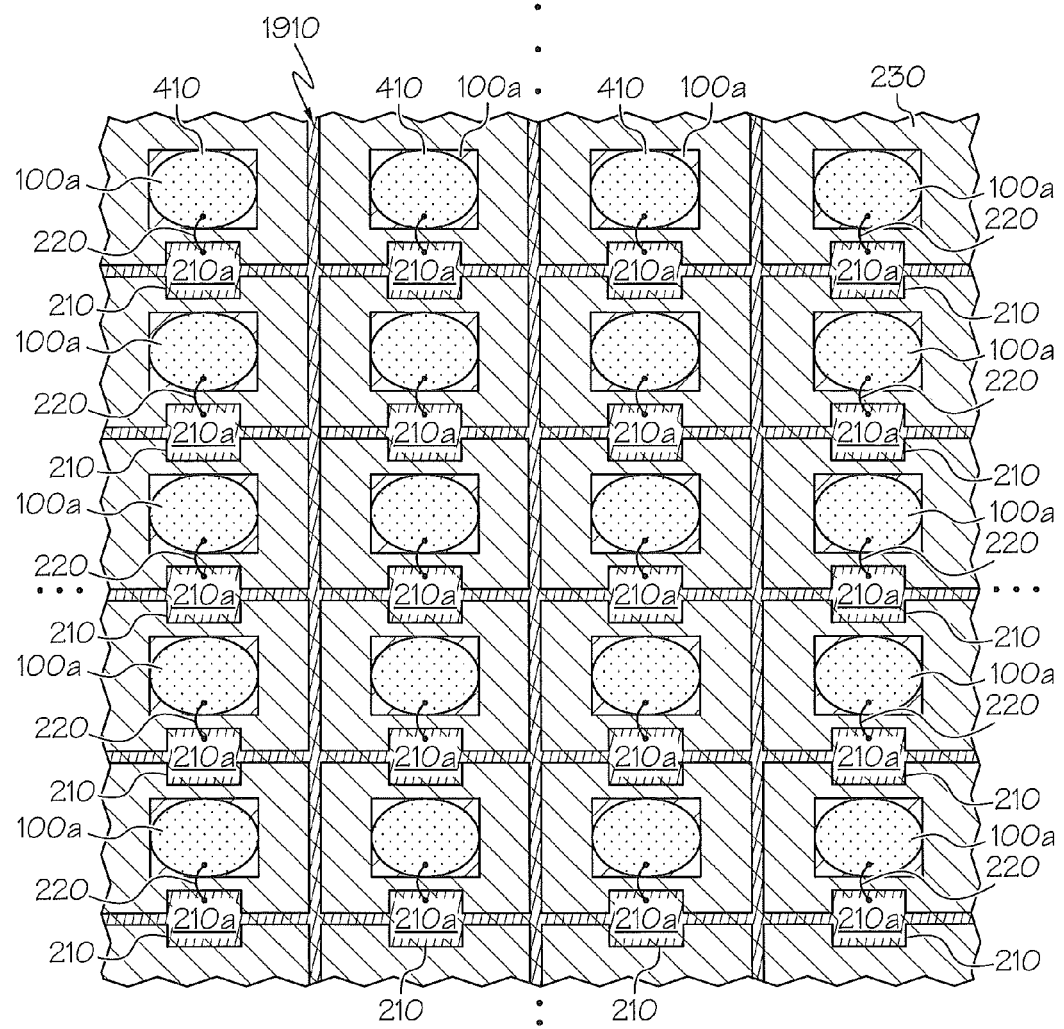

Specifically, after providing the LED dies 100 and the lead frames 1910 on a carrier 1920, as was illustrated in FIG. 19, a luminophoric layer may be applied by applying "miniglobs" of a luminophoric material 410 on the first faces 100a of the LED dies 100, as illustrated in FIG. 23. The luminophoric material 410 may comprise silicone with concentrated amounts of phosphor particles therein. Due to surface tension, the miniglobs will form a dome or lens on the first faces of the LED dies when it hardens, as schematically illustrated in FIG. 23. In other embodiments, the LED dies may already include a luminophoric layer on the first face 100a thereof, in which case the luminophoric layer 410 is on the LED dies before they are placed on the tape in FIG. 19. In either embodiment, referring to FIG. 24, the reflective layer is then applied on the carrier tape, except for on the luminophoric layer 410, similar to that which was described in connection with FIG. 21.

Embodiments of FIGS. 19-24 used a lead frame to provide the wire bond contacts. However, according to other embodiments, a lead frame is not used. Rather, discrete sets of contacts (i.e., slugs) are placed on a carrier tape.

Figure 25:
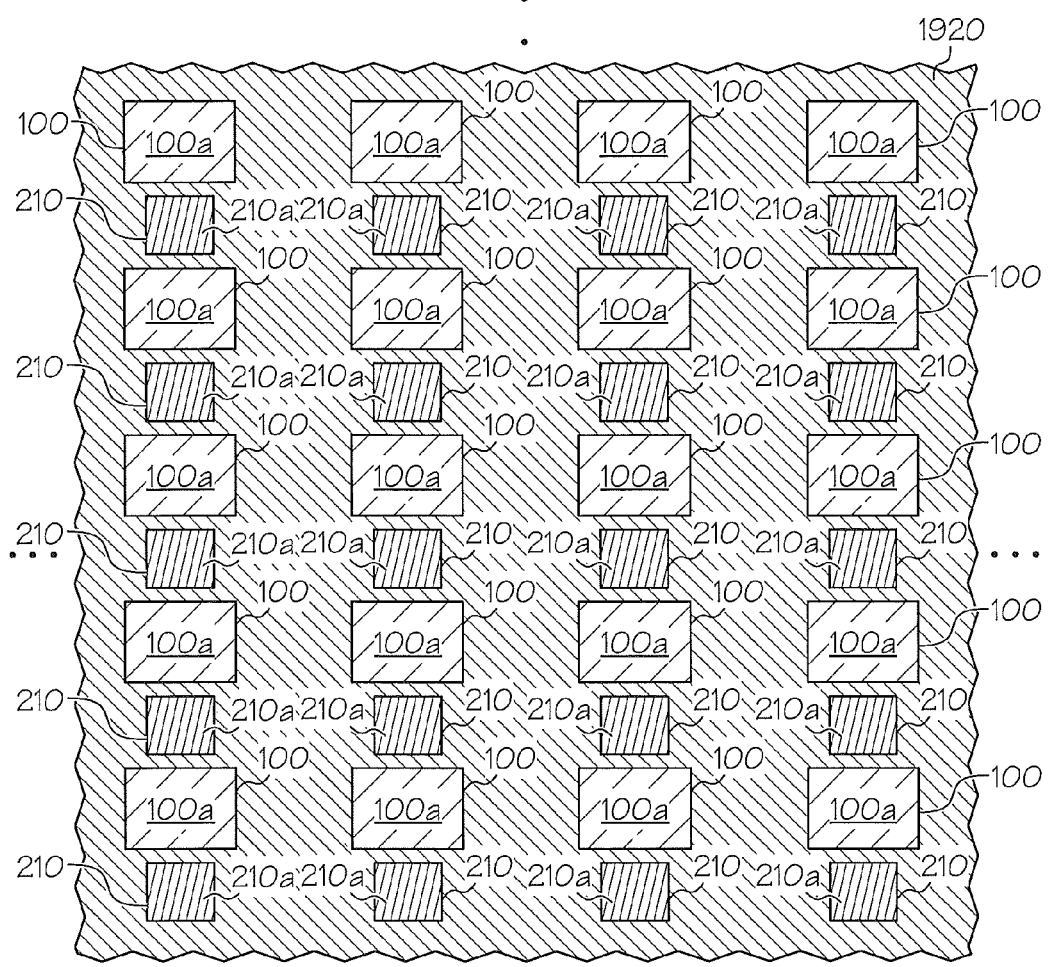
FIG. 25 is a top view of a plurality of LED components during fabrication thereof according to various other embodiments described herein.

Specifically, referring now to FIG. 25, a plurality of LED dies 100 and a plurality of discrete contacts 210 are placed upon the carrier tape 1920. Pick and place techniques may be used. Wire bonding may then be performed, as was illustrated in FIG. 20, followed by forming a reflective layer and then forming a layer comprising luminophoric material, as was illustrated in FIGS. 21 and 22, or by forming a layer of luminophoric material and then forming a reflective layer, as was described in FIGS. 23 and 24.

Figure 26:
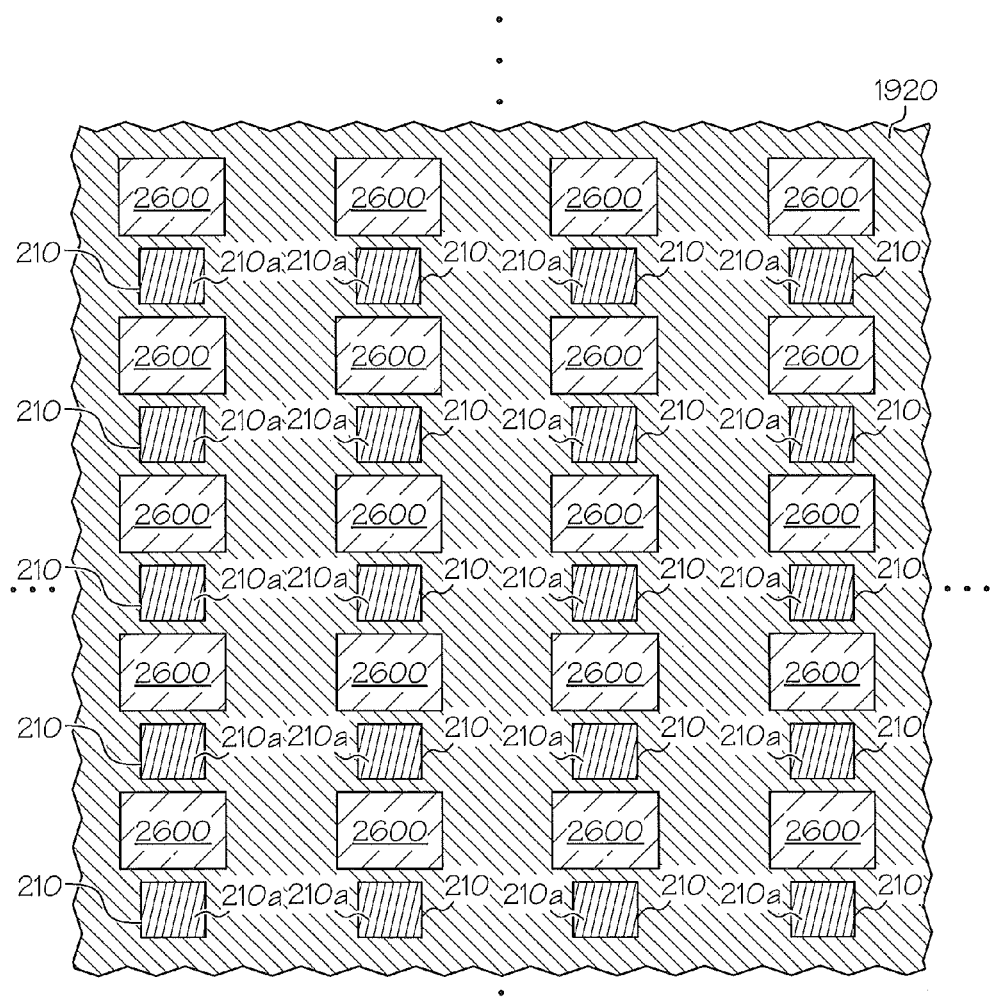
FIGS. 26-27 are top views of a plurality of LED components during fabrication thereof according to still other embodiments described herein.

In still other embodiments, as was described in connection with FIG. 19, it may be desirable to provide a non-wire bond contact to the second face 100b of LED die 100 for purposes of electrical and/or thermal connection. In these embodiments, a non-wire bond contact may be placed on the carrier die as part of a lead frame structure or as part of discrete contacts, as illustrated in FIG. 26. In FIG. 26, an array of non-wire bond contacts 2600 is placed on the carrier tape 1920 prior to, after and/or interleaved with the placement of the wire bond contacts 210. The LED dies 100 may then be placed on the non-wire bond contacts 2600 to provide the top view that was illustrated in FIG. 25. Operations may then continue as was already described in connection with FIG. 25. In yet other embodiments, the non-wire bond contacts may be attached to the LED die before the LED dies are placed on the carrier tape, using soldering, other conductive die attach techniques and/or non-conductive epoxy or other glues.

Figure 27:
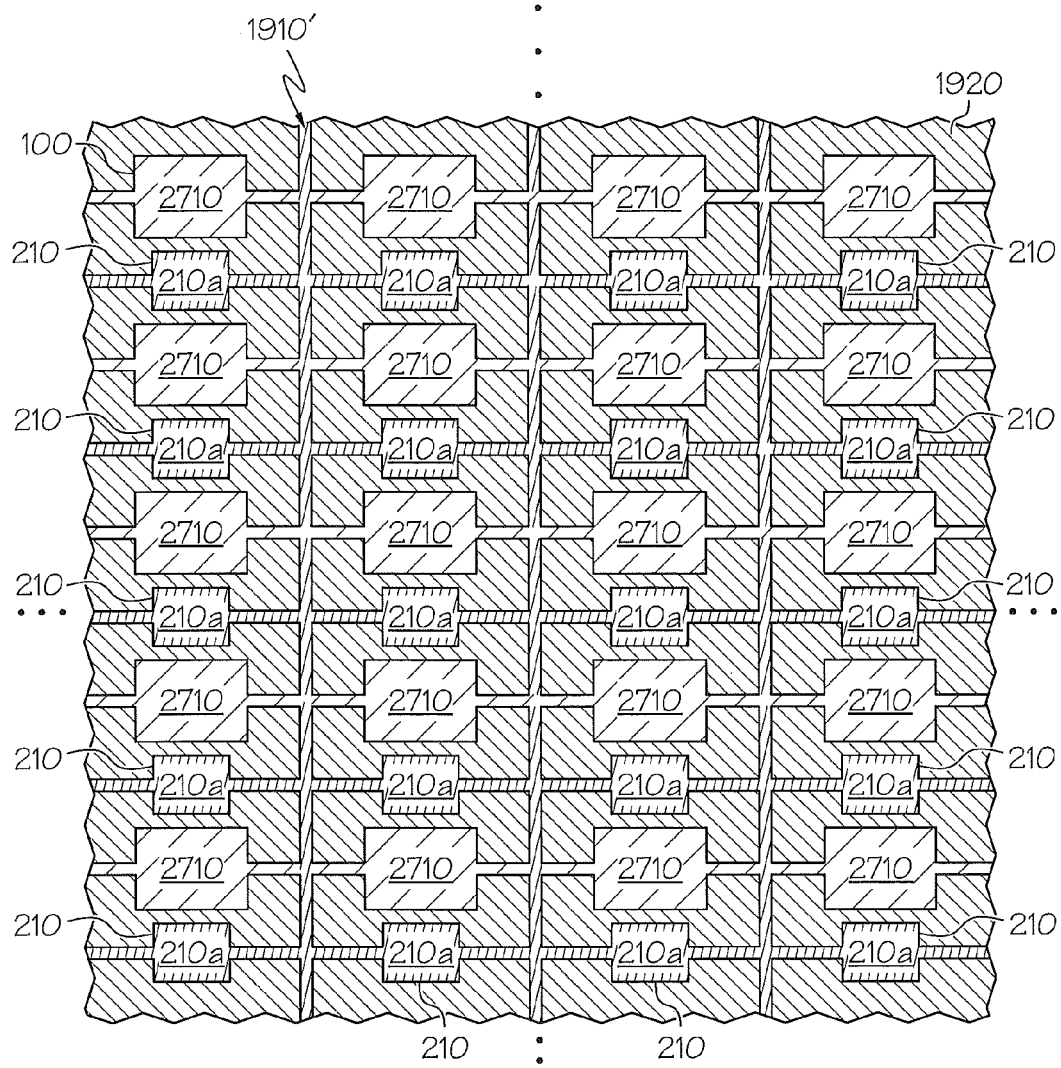

Referring to FIG. 27, as was described above in connection with FIG. 26, in some embodiments, it may be desirable to provide a non-wire bond contact for the second face 100b of the LED die 100 for electrical and/or thermal purposes. In these embodiments, the lead frame 1910' may also include an array of non-wire bond contacts 2710. After placing the lead frame 1910' on the carrier 1920, the second faces 100b of the LED dies 100 may be placed on the non-wire bond contacts 2710 and attached thereto using an electrical or non-electrical die attach technique to produce the structure shown in FIG. 19. Operations may then proceed as was described in connection with FIG. 19.

Methods of fabricating a plurality of LED components according to embodiments of FIG. 13 will now be described.

Figure 28:
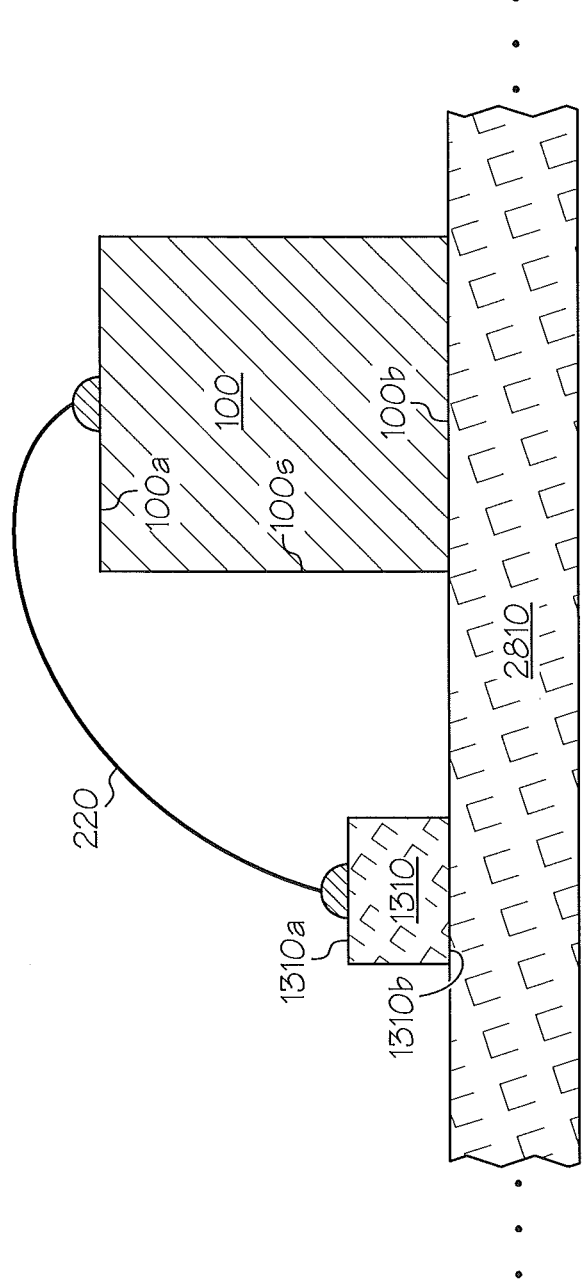
FIGS. 28-30 are cross-sectional views of an LED component during fabrication thereof according to yet other embodiments described herein.
Figure 29:
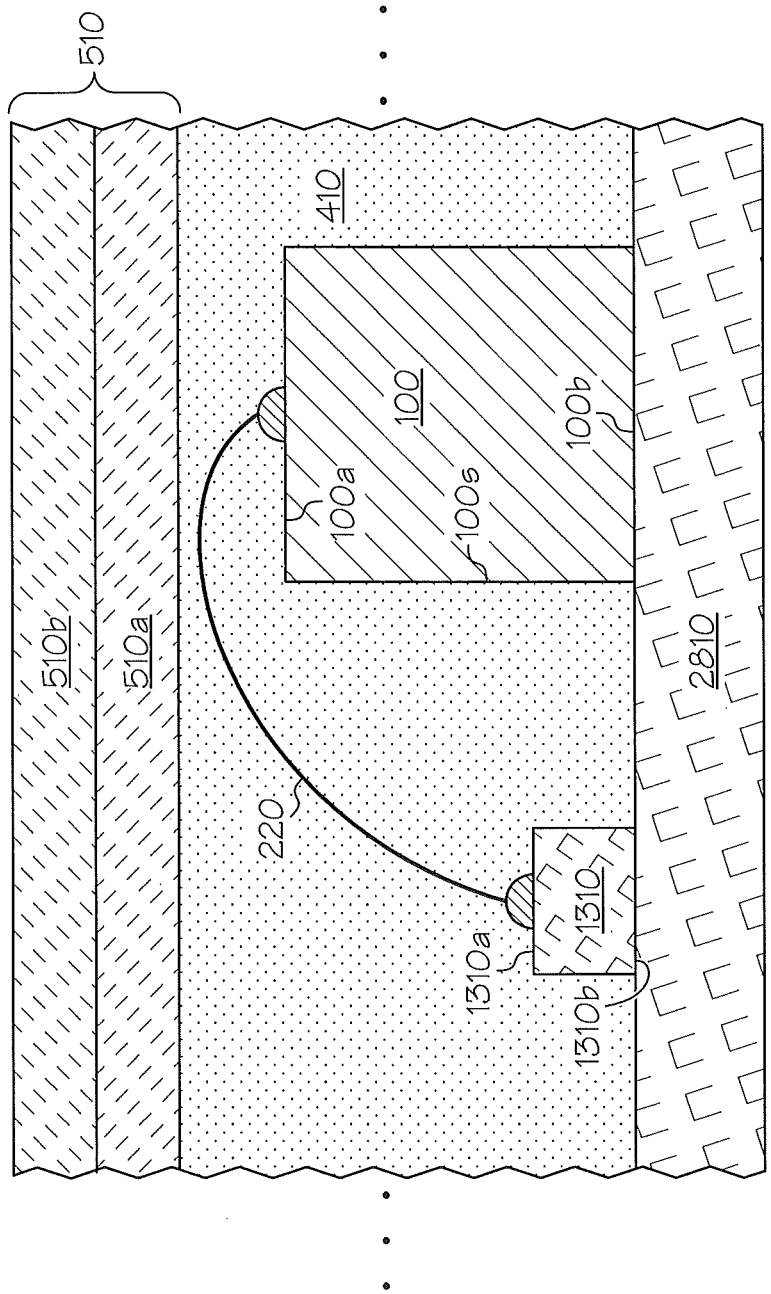

Specifically, referring to FIG. 28, a plurality of LED dies 100 (only one of which is illustrated in FIG. 28 for simplification) and a plurality of contact slugs 1310 (only one of which is illustrated in FIG. 27 for simplification) are placed on a carrier 2810. Then, referring to FIG. 29, a layer 410 comprising luminophoric material may be applied. Optionally, an optically transparent structure 510, which may include an encapsulation layer 510a and a glass layer 510b, may be applied. In other embodiments, the layer 410 may not include luminophoric material therein and/or the layers 510a and/or 510b may include luminophoric material therein and/or thereon. The carrier 2810 is then removed.

Figure 30:
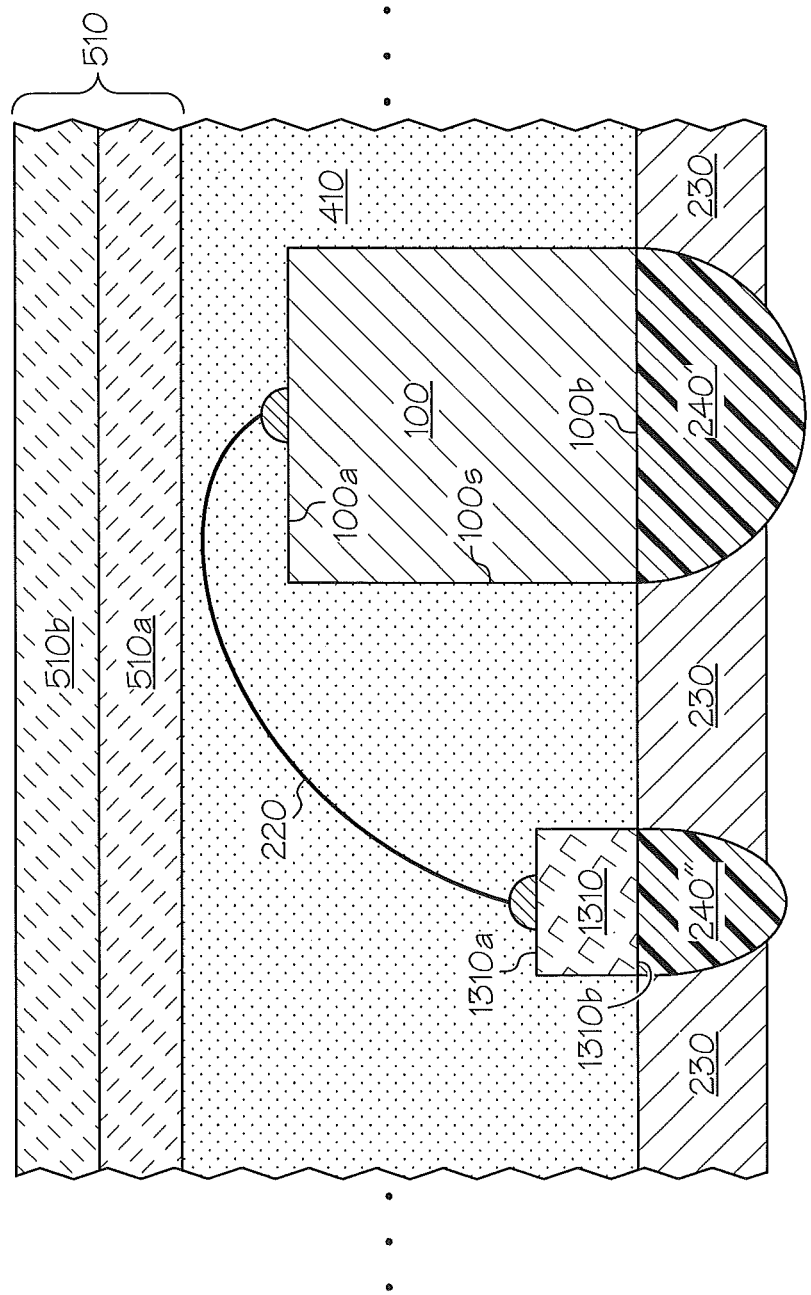

Then, referring to FIG. 30, solder structures 240', 240" and a reflective layer 230 are applied, either by applying the reflective layer 230 and then applying the solder structures 240'/240" or by applying the solder structures 240'/240" first followed by the reflective layer 230. The devices are then singulated. When solder structures, such as solder bumps, are applied first, the reflective layer 230 may be applied with solvent to increase shrinkage, so that the solder structures 240', 240" are exposed for soldering ease. In other embodiments, the solder structures 240', 240" may be ground or quickly/lightly sanded for flat generation to ease soldering. The wire bonds 220 and islands or slugs 1310 can be completely immersed in white paint as illustrated. Flat gold ribbon may be used as an island material for non-emitting sidewall type LED dies and may provide a lowest profile.

Figure 31:
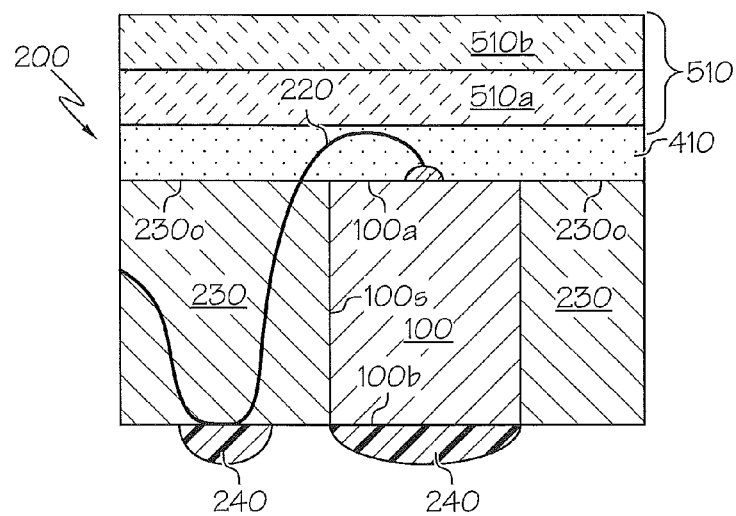
FIG. 31 is a cross-sectional view of an LED component according to yet other embodiments described herein.

FIG. 31 is a cross-sectional view of an LED component according to yet other embodiments described herein. In these embodiments, a separate lead frame or slug as described extensively above need not be used. Rather, a wire bond wire may be directly connected to a solder bump without the need for a lead frame or slug.

Specifically, as illustrated in FIG. 31, the wire bond 220 may comprise a relatively thick copper wire, which is deformed. The component with the deformed wire may then be further processed, as was described in connection with FIG. 6.

Figure 32:
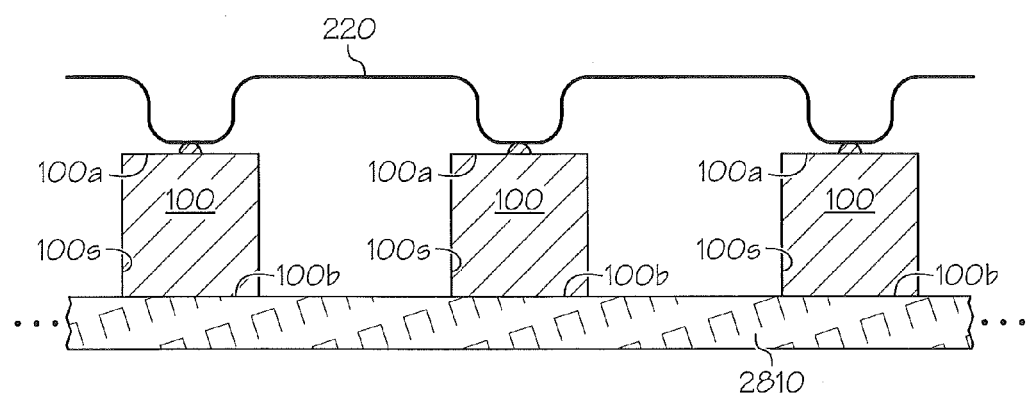
FIGS. 32-34, 35A and 35B are cross-sectional views of an LED component of FIG. 31 during fabrication thereof according to various embodiments described herein.

FIGS. 32-35 illustrate an LED component of FIG. 31 during fabrication thereof, according to various embodiments described herein. As shown in FIG. 32, a plurality of LED dies 100 are placed on a carrier 2810, as was described extensively above. The carrier 2810 may comprise a support substrate and a high temperature tape thereon. As illustrated in FIG. 32, the LED dies 100 are wire bonded, for example using a heavy gauge, long wire bond wire 220 that is capable of deformation and has sufficient area for adherence of solder thereto. In some embodiments, copper wire may be used for low cost and solderability. It will be understood that a given LED die 100 (such as the middle die of FIG. 32) may be wire bonded to two adjacent LED dies using the same contact on the first face 100a of the given LED die, or by using different contacts on the first face 100a of the given LED die.

Figure 33:
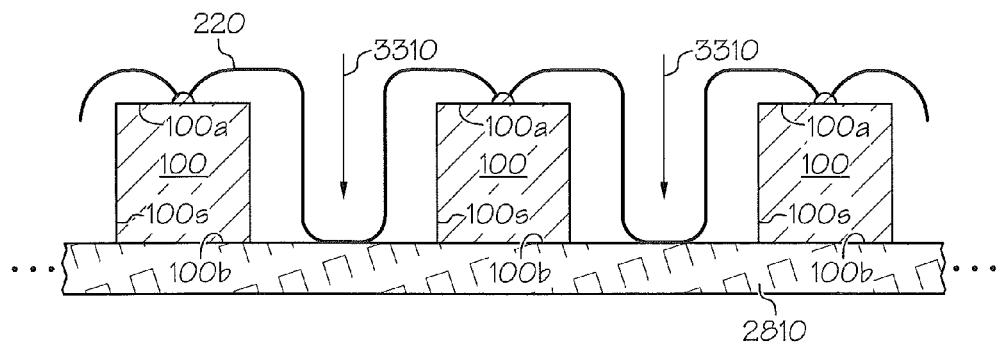
Figure 34:
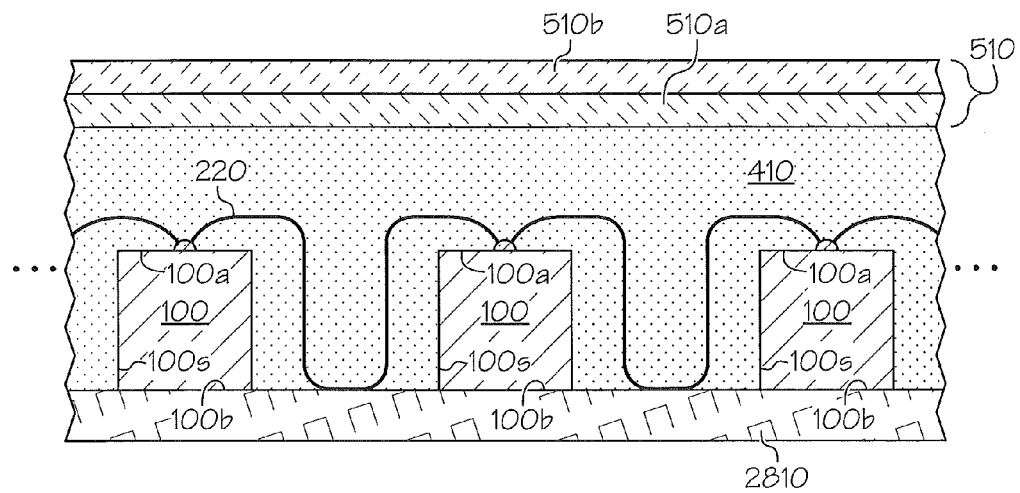
Figure 35A:
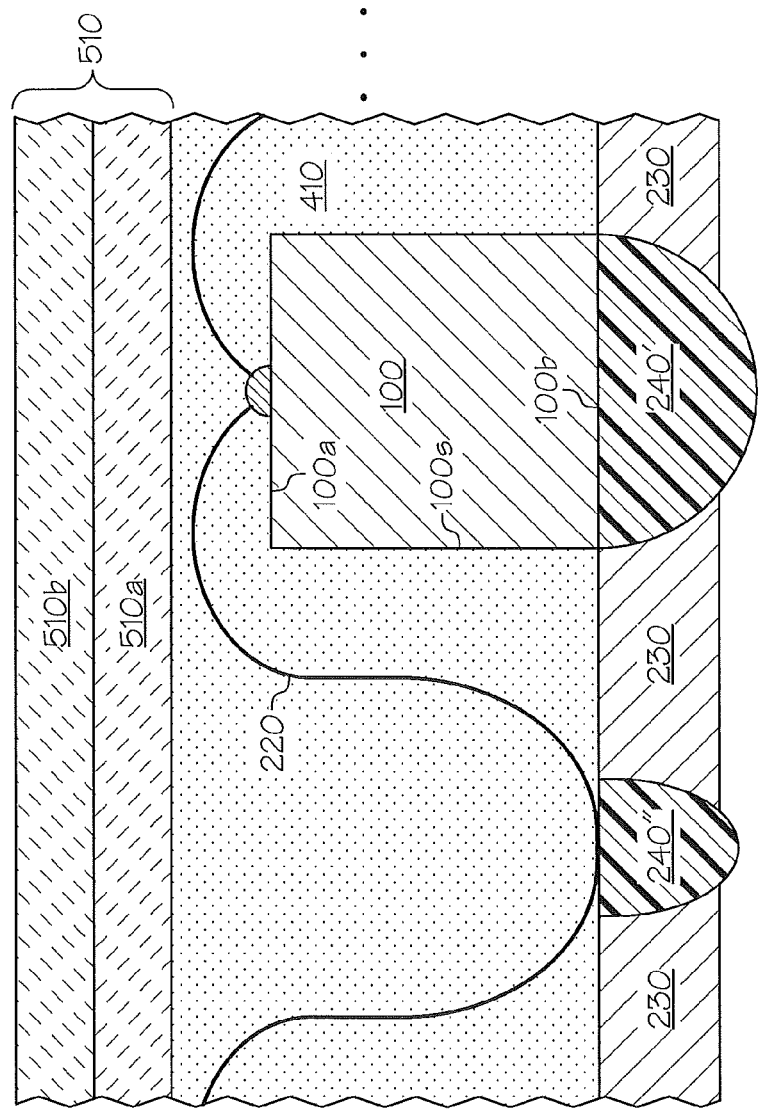
Figure 35B:
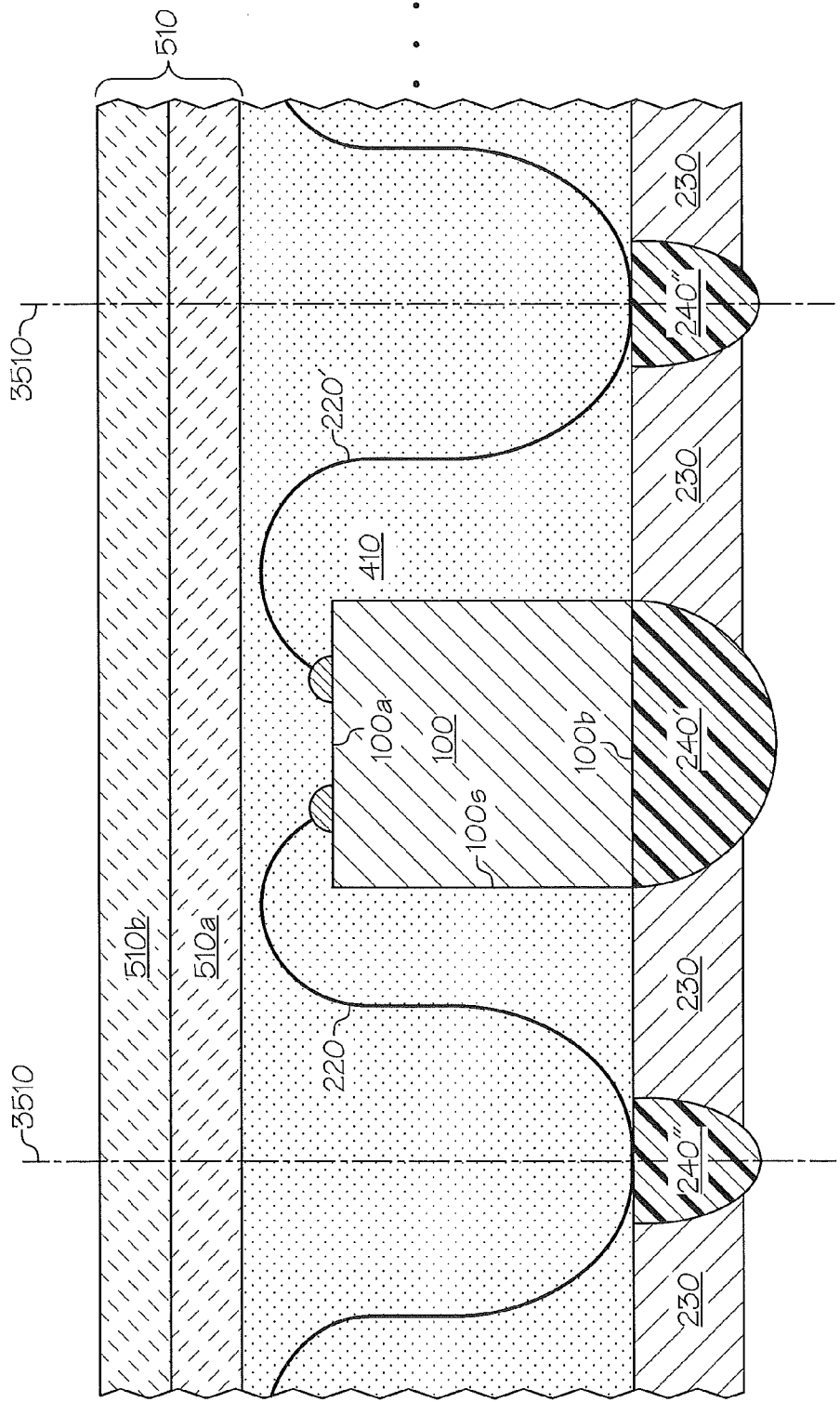

Then, referring to FIG. 33, a mechanical fixture may be used to deform the wire bond wires 220 in the direction shown by arrows 3310. As shown in FIG. 33, the wires 220 may be flattened on the carrier 2810. Then, as shown in FIG. 34, a layer 410 comprising luminophoric material may be applied. Optionally, an optically transparent structure 510, which may include an encapsulation layer 510a and a glass layer 510b, may be applied. In other embodiments, the layer 410 may not include luminophoric material therein and/or the layers 510a and/or 510b may include luminophoric material therein and/or thereon. The carrier 2810 is then removed. The bottom surface may then be polished to expose or further expose the flattened portion of the wire 220. Then, referring to FIG. 35A, solder structures 240', 240" and a reflective layer 230 are applied, for example as was already described in connection with FIG. 30. The solder layer 240" bonds to the flattened portion of the wire 220. The devices are singulated to produce a single component as is illustrated in FIG. 35A.

Embodiments of FIGS. 32-35A illustrated an LED die 100 having a single wire bond to a single solder structure 240". However, in other embodiments described herein, an LED component may be fabricated using an LED die 100 having two contacts on the first face 100a of the LED die, as was illustrated, for example, in FIG. 8. As illustrated in FIG. 35B, in these embodiments, two separate wire bonds 220 and 220' to two separate contacts on a first face 100a of the LED die 100 are provided. A plurality of the LED dies may be placed on a carrier 2810 as illustrated in FIG. 22, with the anode contact of a given LED die adjacent the cathode contact of an adjacent LED die and/or the anode contact of a given LED die adjacent the anode contact of an adjacent LED die. Wire bonding may then take place, wherein a mechanical fixture may be used to deform the wire bond wires, as was illustrated in FIG. 33. Operations of FIG. 34 may then be performed. Singulation between components may then be performed to provide a plurality of the components of FIG. 35B. In some embodiments, singulation may take place in the middle of the flattened wire bonds and the adjacent solder structures 240", as shown by the lines 3510 of FIG. 35B. As shown in FIG. 35B, the LED component may include a central isolated thermal contact pad 240' at the bottom of the component, a positive connection 240' at one end and a negative connection 240' at the other end. Thus, for example, sapphire LED dies having two topside contacts may be fabricated into an LED component according to various embodiments described herein.

Figure 36:
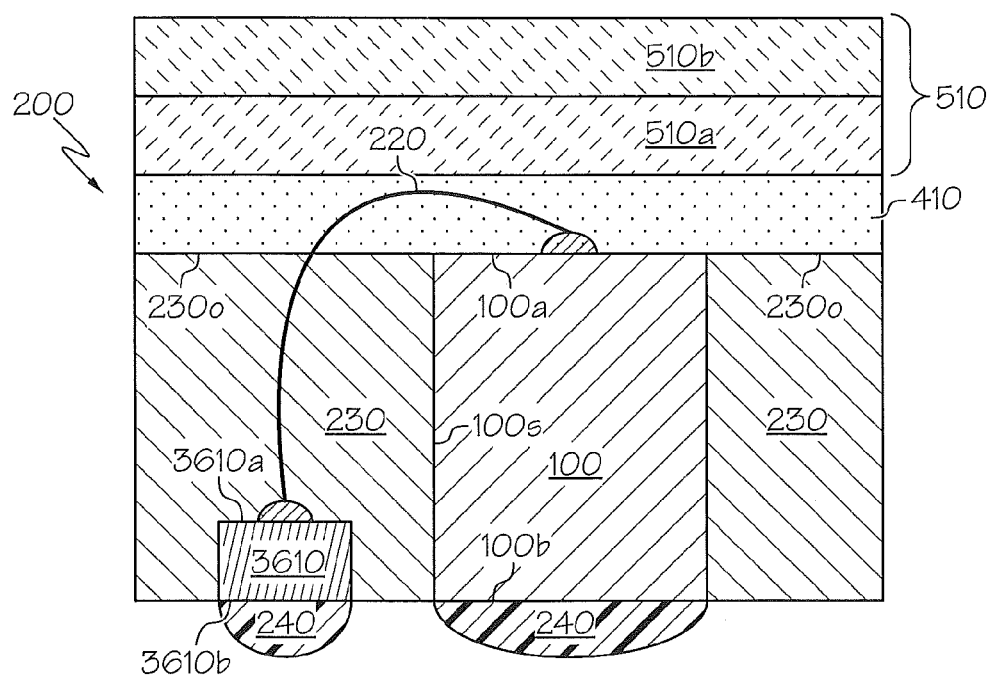
FIG. 36 is a cross-sectional view of an LED component according to still other embodiments described herein.

FIG. 36 is a cross-sectional view of an LED component according to still other embodiments described herein. In these embodiments, a slug 3610 is created using solder itself and/or another cast molten metal.

Figure 37:
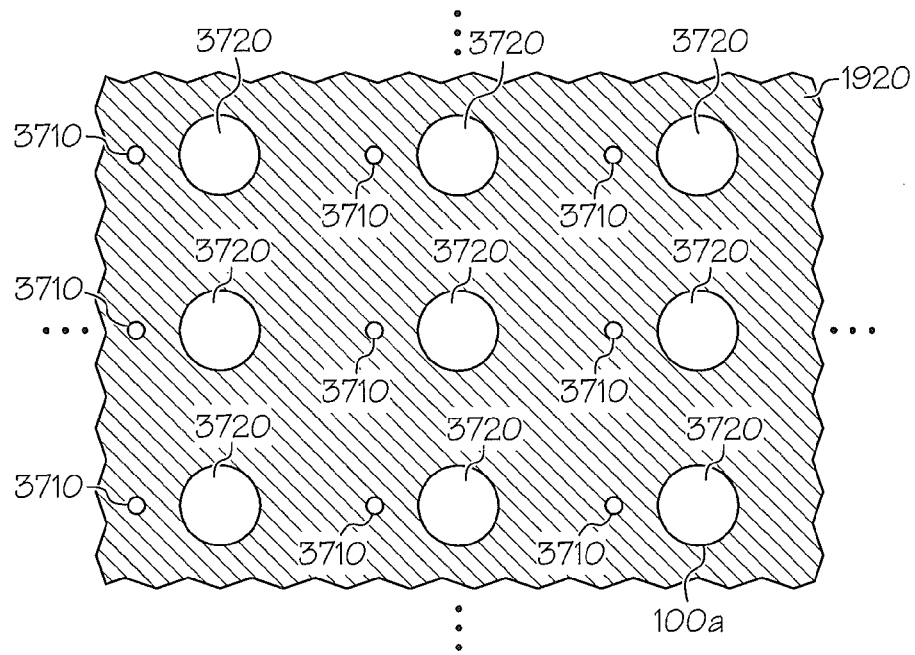
FIGS. 37-38 are top views of a plurality of LED components of FIG. 36 during fabrication thereof according to various embodiments described herein.
Figure 38:
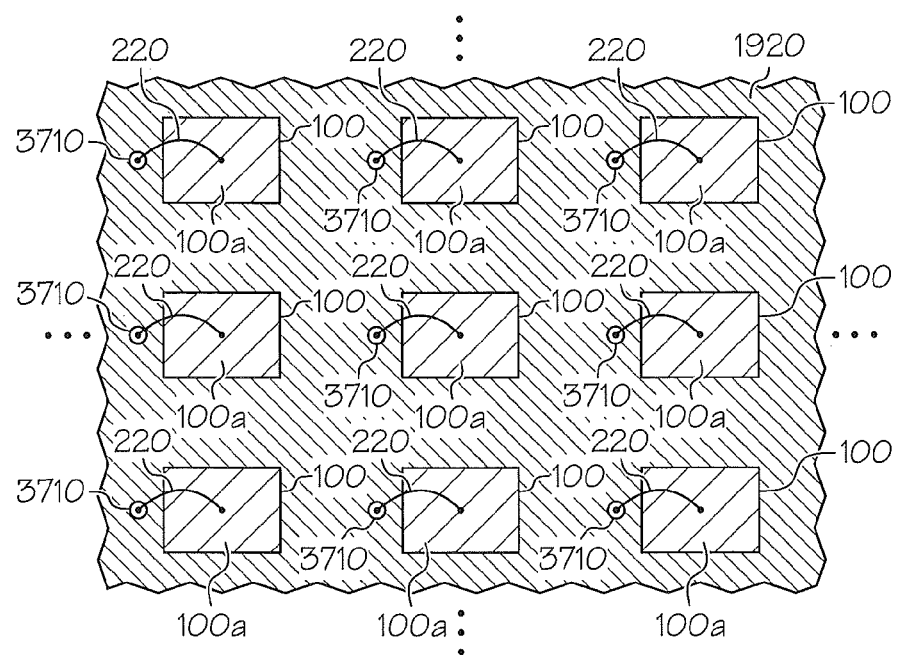

FIGS. 37-38 illustrate fabrication of a plurality of LED components of FIG. 36 according to various embodiments described herein. Specifically, as shown in FIG. 37, an array of solder islands and/or islands of another molten metal are formed on a carrier 1920, which may include a substrate and a high temperature carrier tape thereon. In some embodiments, a plurality of solder islands 3710 and 3720 are formed on the carrier tape. As shown, some of the solder islands 3720 may be larger than others of the solder islands 3710. As will be illustrated below, an LED die may be placed on the larger solder islands 3720 and a wire bond may be attached to the smaller solder islands 3710. Operations of FIG. 37 may be performed by dispensing solder paste and/or screen printing solder paste in the pattern illustrated in FIG. 37. As an alternative to solder paste, molten metal that is wave bondable may be fabricated and then transferred onto the carrier tape 1920. Optionally, the solder islands 3710/3720 may be reflowed, and the solid solder may be pressed into a flat shape.

Then, as illustrated in FIG. 38, LED dies 100 are placed on the large solder islands 3710 and wire bonding takes place between the first face 100a of the LED dies 100 and the smaller solder islands 3710. Later, the solder may be reflowed to form a high strength bond to the wire 220. Operations then proceed as was described, for example, in FIGS. 34 and 35 above. When solder bumping the backside, the solder island 3710 can merge with the new solder bump 240 and strongly bond to the wire 220.

Figure 39:
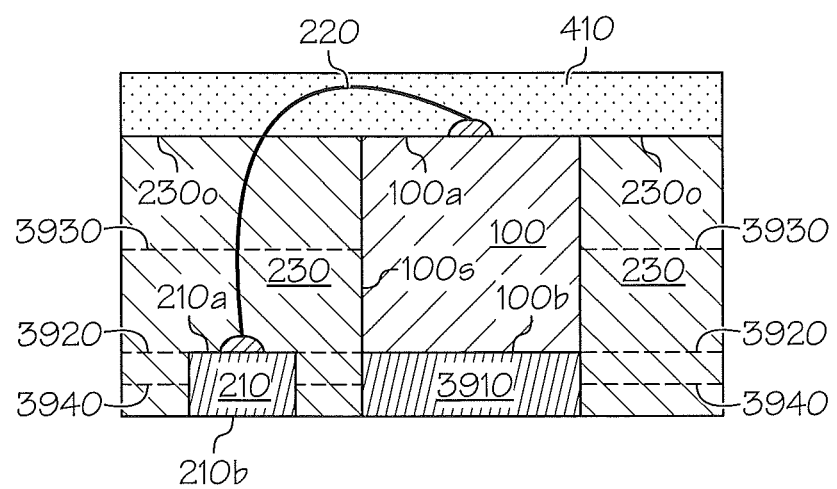
FIG. 39 is a cross-sectional view of an LED component according to still other embodiments described herein.

FIG. 39 is a cross-sectional view of an LED component according to still other embodiments described herein. Embodiments of FIG. 39 may be produced, for example, using methods that were illustrated in FIG. 26 or 27.

Referring to FIG. 39, an LED component includes an LED die 100 and a contact 210 according to any of the embodiments described herein. A non-wire bond contact 3910 is also provided. The contact 210 and the non-wire bond contact 3910 may be provided as discrete contacts, as was illustrated in FIG. 26, wherein non-wire bond contact 3910 may correspond to non-wire bond contact 2600; and/or may be provided as part of a lead frame, as was illustrated in FIG. 27, wherein the non-wire bond contact 3910 may correspond to the non-wire bond contact 2710 that is part of a lead frame. The non-wire bond contact 3910 may have the same area as the second face 100b of the LED die 100, as illustrated in 3910. However, in other embodiments, the non-wire bond contact 3910 may have smaller area or larger area than the second face 100b of the LED die 100. Stated differently, the non-wire bond contact 3910 may be recessed relative to one or more of the sidewalls 100s of the LED die 100 and/or may extend beyond one or more of the sidewalls 100s of the LED die 100.

Still referring to FIG. 39, a reflective layer 230 may be provided according to any of the embodiments described herein. In some embodiments, the reflective layer 230 may only extend to between the inner and outer faces 210a, 210b of the contact 210, as indicated by the dashed line 3940 of FIG. 39. In other embodiments, the reflective layer 230 may extend up to the inner face 210a of the contact 210 and up to the second face 100b of the LED die 100, as indicated by the dashed line 3920. In still other embodiments, the reflective layer 230 may extend onto the sidewall 100s of the LED die, as shown by the dashed line 3930 of FIG. 39. In yet other embodiments, the reflective layer 230 may extend up to the first face 100a of the LED die 100, as indicated by the reference numeral 230o of FIG. 39. In still other embodiments, the layer 230 may also extend onto the first face 100a of the LED die. However, if the layer 230 is reflective, a clear layer, such as a layer 410 comprising luminophoric material, may be provided. In other embodiments, the layer 230 need not be reflective, but, rather, can comprise, for example, a plastic non-reflective layer.

In some embodiments, the layers 230 and 410 may be embodied by silicone material having reflective particles therein to provide layer 230, and having no particles or luminophoric particles therein to provide the layer 410. It will also be understood that embodiments of FIG. 39 may be combined with any and all of the other embodiments described herein.

Additional discussion of various embodiments described herein will now be provided. Various embodiments described herein can merge wafer level white paint processing with wire bonding operations. LED components having reduced cost may be made by eliminating a submount and by allowing wafer level packaging, so that the substrate size can be large and packing density can be high; and/or by allowing cheaper and/or brighter ways to deposit phosphor, including a bilayer approach with phosphor control capability. Various embodiments described herein can be used with EZ or phosphor-containing die, as well as sapphire-based LEDs. Specifically, as was described extensively above, for EZ, phosphor-containing, AlInGaP and/or other types of LEDs with non-emitting sidewalls, white paint may be applied on top of the carrier tape that is initially used to hold the die. This would allow the white paint to cover the sidewalls of the dies. Moreover, there would be no submount in the final configuration. These die have a vertical LED structure, but may not have ESD die protection as one of the connections may be directly to the bottom of the die.

Moreover, as was also described extensively above, vertical structure sidewall emitting die, such as TR type LED dies, can utilize a white paint substrate underneath the plane of the bottom of the die, perhaps minus a small amount where the die is sunk into the carrier tape for the processing. These die would then be metal coated on the bottom for one of the contacts, and may be processed on a wafer scale by adding white paint to the bottom side of the array structure.

Finally, as was also described extensively above, sapphire or two-topside-contact-type LEDs may include a die that has a metalized bottom that is not active and is primarily for heat sinking. Two contact pad slugs or islands would be utilized for wire bond and electrical connection for surface mount applications.

Various embodiments described herein can also allow the use of multiple small dies with spacing, which can be advantageous over larger dies in light output due to less self-absorption by the LED dies. Small dies may also be less costly than larger dies, due to higher die-per-wafer yield. The tradeoff may be more placements and interconnects, but these may be almost free with modern manufacturing techniques. Multiple small dies can be used in low voltage applications, or can be structured together to form higher voltage components. Multiple small dies may be used to form one component without a submount. This can provide increased area for better thermal dissipation compared to a single die solution, which can provide less thermal roll-off of luminous flux. Specifically, thermal management may be better as heat sources may be distributed rather than being concentrated or crowded. Moreover, thermal management may be better as connecting substrate pads may be made larger with better heat conduction possible. Finally, an increase in luminous flux may be provided due to less self-absorption compared to a single die.

In other embodiments, a single multi-die component may be used for multiple voltages or staged turn-on within a component. Moreover, since no submount is required, cost and/or reliability may be increased. The increase in die perimeter area compared to a single die can correlate to efficiency gain. It will also be understood that various embodiments described herein may require more accurate placement of a component on a board, because the component may be larger. Moreover, handling this larger component may be mitigated using existing multiple ejector pin arrangements that can eject a large component from a carrier sheet.

Various embodiments described herein can also merge white paint processing with an existing wire bond LED die. Wafer level white paint processing previously required special die fabrication which may add two photolithography levels to the build sequence and which may make the die too expensive to be incorporated into existing projects. In contrast, various embodiments described herein may allow existing wire bond die to be processed without a substrate or submount, which can save cost, and in a matrix format similar to wafer level processing. A basic lead frame and/or contact slugs may be used and the white paint processing can immediately save 3% of light by eliminating the need for gel. Flexible arrangements are also possible ranging from single components to series and/or parallel in one array. Alternative embodiments, such as creative or artistic designs also may be provided as lead frame/contact slug manufacturing and is cheap, and may even be available in home kits. Other embodiments such as clothing enhancement and flexible components may be provided.

Accordingly, various embodiments described herein need not provide extra photolithography levels, but rather can use an existing wire bondable die. Moreover, lead frames and contact slugs, without molding, can be very cheap and accurate. Low cost LED components may thereby be provided which can eliminate the substrate, and can use white paint for enhanced brightness. Smaller die may be used which may be lower cost and efficient. In other embodiments, a glass sheet may be used for brightness and robustness but at a potential tradeoff of singulation. Finally, gel may not be required which can provide a 3% boost in light output automatically.

It will also be understood, however, that the single or multiple die components according to various embodiments described herein, may not be as robust as components that use a ceramic interposer. As such, they may require advanced care in handling, which may be difficult for some SMT fabrication plants. Finally, small areas of exposed lead frame may be produced due to singulation. If the lead frame comprises copper, this may cause oxidation and may cause the small exposed areas of copper to turn green. This may be a common occurrence in other lead frame products, and need not impact performance.

Various embodiments described herein can utilize a reflective layer. These reflective layers can include a dielectric mirror, a white paint reflective layer, such as a titania-filled layer, and/or other white/reflective layer. Many different reflectors can be used including a mirror layer comprising silver, diffuse reflectors, materials comprising a reflective white color, and thin film reflectors, such as metal or dielectric layers. The reflective layer may have various thicknesses, including some which do not exceed the thickness of the anode and cathode contacts. The reflective layer shown may also extend between the anode and cathode contacts. In embodiments where the reflective layer exceeds the height of the anode and cathode contacts, it may be desirable to generate a contact with enough material to overcome the height barrier of the reflective layer and also to have a balanced amount of material on both contact pads so that uniform attachment is achieved.

A reflective layer may comprise any material that is generally used in microelectronic manufacturing to physically and electrically insulate those portions of the circuit to which no solder or soldering is desired. Solder masks may include thermally cured screen-printed masks, dry film and/or screen-applied or curtain-coated liquid photoimageable solder masks. In some embodiments, the solder mask may comprise a conventional photoresist, or any other material that is non-wettable to solder. A solder mask may be less than about 30 µm thick in some embodiments, less than about 5 µm thick in other embodiments, and may be about 1 µm thick or less in still other embodiments. A wide range of thicknesses and materials may be used, as long as effective solder masking takes place. Moreover, in other embodiments, the solder mask may also include virtually any non-metallic coating, such as silicon dioxide and/or silicon nitride, which may be deposited by physical and/or chemical deposition techniques. In still other embodiments, the solder mask may be reflective. Examples of such reflective layers include a dielectric mirror, a white reflective layer, such as a titania-filled layer, and/or other white/reflective layer.

Various embodiments described herein may also include a layer comprising luminophoric material, also referred to as a phosphor layer. The phosphor layer may also extend onto the sidewalls of the diode dies, and/or beyond the anode and cathode contacts. In some embodiments, the phosphor layer is a conformal phosphor layer that may be less than about 150 µm thick in some embodiments, less than about 100 µm thick in other embodiments and less than about 50 µm thick in yet other embodiments. It will be understood that the term "phosphor" is used herein to denote any wavelength conversion material, and may be provided according to various configurations. The phosphor layer may also be any type of functional layer or layers, such as any layer disposed to affect the properties of the emitted light, for example, color, intensity and/or direction.

Various techniques may be used to apply the phosphor layer, including dispensing, screen printing, film transfer, spraying, coating and/or other techniques. Phosphor preforms also may be applied. In some embodiments, the phosphor layer may comprise silicone and/or other transparent material having phosphor particles therein. It will also be understood that the phosphor layer may be coplanar with the outer face of the LED dies. However, the outer or edge portions of the phosphor layer need not be co-planar with these outer faces. Specifically, it can be recessed from the outer faces or may protrude beyond the anode and cathode contacts.

The phosphor layer may be a thin conformal layer having uniform phosphor particle density. However, a phosphor layer may be provided that comprises phosphor particles that are nonuniformly dispersed therein, and that, in some embodiments, may include a phosphor-free region at the exterior surfaces of the phosphor layer. Moreover, the phosphor layer may also be configured as a conformal layer.

The phosphor layer, or any wavelength conversion layer, converts a portion of the light emitted from the LED die to a different wavelength, a process that is known in the art. One example of this process, is converting a portion of blue-emitted light from light emitter, such as an LED die, to yellow light. Yttrium aluminum garnet (YAG) is an example of a common phosphor that may be used.

In some embodiments, the phosphor particles comprise many different compositions and phosphor materials alone or in combination. In one embodiment the single crystalline phosphor can comprise yttrium aluminum garnet (YAG, with chemical formula $Y_3Al_5O_{12}$). The YAG host can be combined with other compounds to achieve the desired emission wavelength. In one embodiment where the single crystalline phosphor absorbs blue light and reemits yellow, the single crystalline phosphor can comprise YAG:Ce. This embodiment is particularly applicable to light emitters that emit a white light combination of blue and yellow light. A full range of broad yellow spectral emission is possible using conversion particles made of phosphors based on the $(Gd,Y)_3(Al,Ga)_5O_{12}$:Ce system, which include $Y_3Al_5O_{12}$:Ce (YAG). Other yellow phosphors that can be used for white emitting LED chips include:

$Tb_{3-x}Re_xO_{12}$:Ce (TAG);
RE=Y, Gd, La, Lu; and/or
$Sr_{2-x-y}Ba_xCa_ySiO_4$:Eu.

In other embodiments, other compounds can be used with a YAG host for absorption and re-emission of different wavelengths of light. For example, a YAG:Nb single crystal phosphor can be provided to absorb blue light and reemit red light. First and second phosphors can also be combined for higher CRI white (i.e., warm white) with the yellow phosphors above combined with red phosphors. Various red phosphors can be used including:

$Sr_xCa_{1-x}S$:Eu,Y; Y=halide;
$CaSiAlN_3$:Eu; or
$Sr_{2-y}Ca_ySiO_4$:Eu.

Other phosphors can be used to create saturated color emission by converting substantially all light to a particular color. For example, the following phosphors can be used to generate great saturated light:

$SrGa_2S_4$:Eu;
$Sr_{2-y}Ba_ySiO_4$:Eu; or
$SrSi_2O_2N_2$:Eu.

The following lists some additional suitable phosphors that can be used as conversion particles, although others can be used. Each exhibits excitation in the blue and/or UV emission spectrum, provides a desirable peak emission, has efficient light conversion:

Yellow/Green
$(Sr,Ca,Ba)(Al,Ga)_2S_4$:$Eu^{2+}$
$Ba_2(Mg,Zn)Si_2O_7$:$Eu^{2+}$
$Gd_{0.46}Sr_{0.31}Al_{1.23}O_xF_{1.38}$:$Eu^{2+}_{0.6}$
$(Ba_{1-x-y}Sr_xCa_y)SiO_4$:Eu
$Ba_2SiO_4$=$Eu^{2+}$
Red
$Lu_2O_3$=$Eu^{3+}$
$(Sr_{2-x}La_x)(Ce_{i-x}Eu_x)O_4$
$Sr_2C_{1-x}Eu_xO_4$
$SrTiO_3$:$Pr^{3+}$, $GA^{3+}$
$CaAlSiN_3IEu^{2+}$
$Sr_2Si_5N_8$=$Eu^{2+}$ In some embodiments, the layer comprising luminophoric material, the optical coupling layer and/or the optically transparent structure may also provide a functional layer which comprises a light scattering layer, which comprises a binder material as discussed above and light scattering particles, for example titanium oxide particles. In other embodiments, the layer comprises materials to alter the refractive index of the functional layer. In some embodiments, the functional layer comprises a combination of one or more of the types of functional layers described herein (e.g. a wavelength conversion layer and a scattering or refractive index altering layer).

In some embodiments, the LED die is configured to emit blue light, for example light having a dominant wavelength of about 450-460 nm, and the phosphor layer comprises yellow phosphor, such as YAG:Ce phosphor, having a peak wavelength of about 550 nm. In other embodiments, the LED die is configured to emit blue light upon energization thereof, and the phosphor layer may comprise a mixture of yellow phosphor and red phosphor, such CASN-based phosphor. In still other embodiments, the LED die is configured to emit blue light upon energization thereof, and the phosphor layer may comprise a mixture of yellow phosphor, red phosphor and green phosphor, such as LuAG:Ce phosphor particles. Moreover, various combinations and subcombinations of these and/or other colors and/or types of phosphors may be used in mixtures and/or in separate layers. In still other embodiments, a phosphor layer is not used. For example, a blue, green, amber, red, etc., LED need not use phosphor. In embodiments which do use a phosphor, it may be beneficial to provide a uniform coating in order to provide more uniform emissions.

The optical coupling material may comprise silicone without phosphor particles therein, and may provide a primary optic for the light emitting device. The optical coupling material that is free of phosphor may be shaped to provide a lens, dome and/or other optical component, so that the sides and/or tops thereof may be oblique to the diode region. The optical coupling material that is free of phosphor may also encapsulate the phosphor layer and/or light emitting surfaces of the LED die. The optical coupling layer may be at least 1.5 mm thick in some embodiments, at least 0.5 mm thick in other embodiments, and at least 0.01 mm thick in yet other embodiments, and may not be present in still other embodiments. Thus, in other embodiments, an optical coupling material layer may be used without a phosphor layer. For example, the optical coupling material may be directly on the second face of the LED die. In some embodiments, a relatively thick transparent layer may be used. In other embodiments, a conformal transparent layer may be used. In still other embodiments, the transparent layer may be provided on a phosphor layer that comprises phosphor particles that are non-uniformly dispersed therein. The device may further include an additional encapsulant or lens, which may be silicone or glass. Other embodiments may not include this additional lens.

Various embodiments described herein may also include a board, such as a printed circuit board. The printed circuit board may include any conventional circuit board material that is used to mechanically support and electrically connect electronic components using conductive pathways, tracks or signal traces. The printed circuit board may comprise laminate, copper-clad laminates, resin-impregnated B-stage cloth, copper foil, metal clad printed circuit boards and/or other conventional printed circuit boards. In some embodiments, the printed circuit board is used for surface mounting of electronic components thereon. The printed circuit board may include multiple LED components and any other device thereon, as well as one or more integrated circuit chip power supplies, integrated circuit chip LED controllers and/or other discrete and/or integrated circuit passive and/or active microelectronic components, such as surface mount components thereon.

Various embodiments of luminophoric layers comprising phosphor, optical coupling material, reflective layers and boards, are described, for example, in the above incorporated U.S. patent application Ser. No. 14/289,305 and in U.S. patent application Ser. No. 14/152,829 to Bhat et al. entitled "Wafer Level Contact Pad Solder Bumping for Surface Mount Devices With Non-Planar. Recessed Contacting Surfaces", U.S. patent application Ser. No. 14/201,490 to Bhat et al. entitled "Wafer Level Contact Pad Standoffs With Integrated Reflector", and U.S. patent application Ser. No. 13/017,845 to Donofrio et al. entitled "Conformally Coated Light Emitting Devices and Methods for Providing the Same", assigned to the assignee of the present application, the disclosures of which are hereby incorporated herein by reference in their entirety as if set forth fully herein.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A Light Emitting Diode (LED) component comprising:
   an LED die that comprises first and second opposing faces and a die sidewall extending therebetween;
   a contact that is spaced apart from the LED die, the contact comprising an inner face adjacent the first face and an outer face adjacent the second face;
   a wire bond that extends between the first face and the inner face; and
   a reflective layer on the inner face that extends to the die sidewall and also extends along the die sidewall,
   wherein the reflective layer includes an outer surface that is coplanar with the first face.

2. An LED component according to claim 1 further comprising:
   a solder layer on the second face.

3. An LED component according to claim 1 further comprising:
   a layer comprising luminophoric material on the first face, wherein the reflective layer does not extend onto the first face.

4. An LED component according to claim 1 further comprising a layer comprising luminophoric material on the first face and extending onto the outer surface.

5. A Light Emitting Diode (LED) component comprising:
   an LED die that comprises first and second opposing faces and a die sidewall extending therebetween;
   a contact that is spaced apart from the LED die, the contact comprising an inner face adjacent the first face and an outer face adjacent the second face;
   a wire bond that extends between the first face and the inner face; and
   a reflective layer on the inner face that extends to the die sidewall and also extends along the die sidewall,
   wherein the contact comprises a portion of a lead frame, the lead frame comprising a conductive layer including therein the contact, another contact and a severable interconnection that connects the contact and the another contact.

6. An LED component according to claim 5 wherein the contact includes a tab that extends therefrom, the tab comprising a portion of the severable interconnection.

7. An LED component according to claim 1 wherein the contact comprises a slug.

8. An LED component according to claim 7 wherein the slug comprises an insulating body, a conductive layer on opposing faces thereof, and a conductive via that extends in and/or on the insulating body to electrically connect the conductive layers on the opposing faces of the slug.

9. An LED component according to claim 7 wherein the slug comprises a copper slug having a reflective metal layer on opposing faces thereof.

10. An LED component according to claim 7 wherein the slug comprises a portion of a wire and/or a solder slug.

11. An LED component according to claim 1 further comprising an optically transparent structure on the reflective layer and on the first face.

12. An LED component according to claim 11 wherein the optically transparent structure comprises an encapsulation layer on the reflective layer and on the first face and a glass layer on the encapsulation layer, remote from the reflective layer and the first face.

13. An LED component according to claim 1 on a board along with other electronic components, wherein the LED component is free of a submount between the LED die and the board.

14. An LED component according to claim 1 wherein the reflective layer comprises white paint.

15. An LED component according to claim 1 wherein the contact is a first contact and the wire bond is a first wire bond, the LED component further comprising:
   a second contact that is spaced apart from the LED die and the first contact, the second contact also comprising an inner face adjacent the first face and an outer face adjacent the second face; and
   a second wire bond that extends between the first face and the inner face of the second contact,
   wherein the reflective layer also extends on the inner face of the second contact.

16. A Light Emitting Diode (LED) component comprising:
   an LED die that comprises first and second opposing faces and a die sidewall extending therebetween;
   a slug that is spaced apart from the LED die, the slug comprising an inner face adjacent the first face and an outer face adjacent the second face;
   a wire bond that extends between the first face and the inner face;
   a first solder structure on the second face and including a first solder structure sidewall;
   a second solder structure on the outer face and including a second solder structure sidewall that faces the first solder structure sidewall; and
   a reflective layer that extends between the first solder structure sidewall and the second solder structure sidewall.

17. An LED component according to claim 16 further comprising:
   a layer comprising luminophoric material on the first face, on the die sidewall, on the reflective layer and on the inner face.

18. An LED component according to claim 16 wherein the slug comprises an insulating body, a conductive layer on opposing faces thereof, and a conductive via that extends in and/or on the insulating body to electrically connect the conductive layers on the opposing faces of the slug.

19. An LED component according to claim 16 wherein the slug comprises a copper slug having a reflective metal layer on opposing faces thereof.

20. An LED component according to claim 16 wherein the slug comprises a portion of a wire and/or a solder slug.

21. An LED component according to claim 17 further comprising an optically transparent structure on the layer comprising luminophoric material.

22. An LED component according to claim 21 wherein the optically transparent structure comprises an encapsulation layer on the layer comprising luminophoric material and a glass layer on the encapsulation layer.

23. An LED component according to claim 16 on a board along with other electronic components, wherein the LED component is free of a submount between the LED die and the board.

24. An LED component according to claim 16 wherein the reflective layer comprises white paint.

25. An LED component according to claim 16 wherein the slug is a first slug and the wire bond is a first wire bond, the LED component further comprising:

a second slug that is spaced apart from the LED die and the first slug, the second slug also comprising an inner face adjacent the first face and an outer face adjacent the second face;

a second wire bond that extends between the first face and the inner face of the second slug; and a third solder structure on the outer face of the second slug and including a third solder structure sidewall that faces the first and/or second solder structure sidewalls;

wherein the reflective layer also extends between the third solder structure sidewall and the first and/or second solder structure sidewalls.

26. An LED component according to claim 5 further comprising a layer comprising luminophoric material on the first face and extending onto the outer surface.

27. An LED component according to claim 5 further comprising an optically transparent structure on the reflective layer and on the first face.

* * * * *